US012635557B2

(12) United States Patent
Luan

(10) Patent No.: US 12,635,557 B2
(45) Date of Patent: May 19, 2026

(54) SENSOR PACKAGE INCLUDING A SENSOR DIE

(71) Applicant: STMICROELECTRONICS PTE LTD, Singapore (SG)

(72) Inventor: Jing-En Luan, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 760 days.

(21) Appl. No.: 17/874,052

(22) Filed: Jul. 26, 2022

(65) Prior Publication Data

US 2023/0029799 A1 Feb. 2, 2023

Related U.S. Application Data

(60) Provisional application No. 63/226,599, filed on Jul. 28, 2021.

(51) Int. Cl.
| | |
|---|---|
| *H01L 23/31* | (2006.01) |
| *H10F 39/00* | (2025.01) |
| *H10W 74/10* | (2026.01) |

(52) U.S. Cl.
CPC ........ *H10W 74/129* (2026.01); *H10F 39/024* (2025.01); *H10F 39/026* (2025.01); *H10W 74/124* (2026.01)

(58) Field of Classification Search
None
See application file for complete search history.

(56) References Cited

U.S. PATENT DOCUMENTS

| | | | |
|---|---|---|---|
| 6,245,597 | B1 | 6/2001 | Fernandez |
| 8,193,555 | B2 | 6/2012 | Lin et al. |
| 8,604,436 | B1 | 12/2013 | Patel et al. |
| 8,933,386 | B2 | 1/2015 | Kamamori et al. |
| 9,316,584 | B2 | 4/2016 | Jonishi et al. |
| 10,808,150 | B2 | 10/2020 | Kato et al. |
| 2010/0117175 | A1 | 5/2010 | Shizuno |
| 2010/0327421 | A1 | 12/2010 | Luan |
| 2013/0194464 | A1 | 8/2013 | Suzuki et al. |
| 2016/0307957 | A1 | 10/2016 | A Tharumalingam |
| 2017/0062628 | A1 | 3/2017 | Shen et al. |
| 2017/0186886 | A1 | 6/2017 | Weng et al. |
| 2017/0287886 | A1 | 10/2017 | Gani |
| 2019/0006561 | A1 | 1/2019 | Chun-Hung et al. |

(Continued)

FOREIGN PATENT DOCUMENTS

CN 109962041 A 7/2019

*Primary Examiner* — Hung K Vu
(74) *Attorney, Agent, or Firm* — Seed IP Law Group LLP

(57) ABSTRACT

The present disclosure is directed to embodiments of sensor package including a doped resin on respective surfaces and sidewalls of a transparent portion, a sensor die, and a support structure extending from the transparent portion to the sensor die. The support structure suspends the transparent portion over a sensor of the sensor die. The doped resin is doped with an additive material, and the additive material is activated by exposing the doped resin to a laser. The doped resin is exposed to the laser forming conductive layers extending along the doped resin for providing electrical connections within the sensor package and to electronic components external to the embodiments of the sensor die packages. The conductive layers are at least partially covered by a non-conductive layer.

20 Claims, 17 Drawing Sheets

(56) References Cited

U.S. PATENT DOCUMENTS

| | | |
|---|---|---|
| 2019/0195685 A1 | 6/2019 | Herard et al. |
| 2021/0066198 A1 | 3/2021 | Chen et al. |
| 2021/0193483 A1* | 6/2021 | Shim .................... H10F 39/804 |

* cited by examiner

SENSOR PACKAGE INCLUDING A SENSOR DIE

BACKGROUND

Technical Field

The present disclosure is directed to a sensor package including at least one conductive layer aligned with a sidewall of the sensor die.

Description of the Related Art

Generally, sensor packages, such as chip scale packages or wafer level chip scale packages (WLCSPs), include integrated circuit die coupled to a surface of a substrate. The integrated circuit die may be a sensor die configured to detect any number of quantities or qualities, or the integrated circuit die may be a controller such as a microprocessor or a memory utilized to control other various electronic components in or outside the sensor packages. For example, the integrated circuit die may detect light, temperature, pressure, stress, strain, sound, or any other type of quantities or qualities.

A conventional optical sensor package may include a conventional optical sensor die coupled to a first surface of a substrate. The sensor die may be electrically coupled to first conductive pads on the first surface of the substrate by a plurality of wires. Conductive vias are coupled to the first conductive pads and extend through the substrate to second conductive pads at a second surface of the substrate opposite to the first surface. The second conductive pads are utilized to mount or bond the sensor package to an electronic component external to the sensor package such as a printed circuit board (PCB). For example, solder balls may be formed on the second conductive pads and then utilized to couple the sensor package to the PCB.

A transparent glass portion is coupled to a surface of the optical sensor die such that the transparent glass portion covers and overlaps an optical sensor on the surface of the optical sensor die. A molding compound covers sidewalls of the transparent glass portion and the optical sensor die as well as encasing the plurality of wires. The molding compound generally has a first thickness substantially equal to or greater than a summation of a second thickness of the optical sensor die and a third thickness of the transparent glass portion.

BRIEF SUMMARY

The present disclosure illustrates embodiments of sensor die packages including a transparent portion suspended above a sensor of a sensor die. The transparent portion is coupled to the sensor die by the support structure to protect the sensor. Respective sidewalls and surfaces of the transparent portion, the support structure, and the sensor die are covered in a doped resin doped with an additive material, which may be an inorganic non-conductive metallic material. Conductive layers extend along the doped resin. Some of the conductive layers may form electrical connections within the sensor package, and some of the conductive layers may be an electromagnetic (EM) shield or a light shield. For example, when some of the conductive layers are light shields, these conductive layers may reflect light such that the light does not readily enter sidewalls of the transparent portion.

At least some of the embodiment of the sensor packages of the present disclosure may be optical sensor packages. The sensor may be a light sensor that detects a light that enters the package through the transparent portion that is suspended over the sensor. For example, the optical sensor package may be a time of flight sensor.

The conductive layers may be formed by a laser-direct structuring (LDS) technique in which the additive material within the doped resin is activated by exposing selected areas or portions of the doped resin to a laser. After the selected areas or portions of the doped resin are exposed to the laser forming conductive layers, a plating technique (e.g., electroless plating technique) may be carried out for adhere conductive material to the conductive layer formed by the LDS technique.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify the same or similar elements or acts unless the context indicates otherwise. The sizes and relative proportions of the elements in the drawings are not necessarily drawn to scale. For example, some of these elements may be enlarged and positioned to improve drawing legibility.

DETAILED DESCRIPTION

Figure 1:
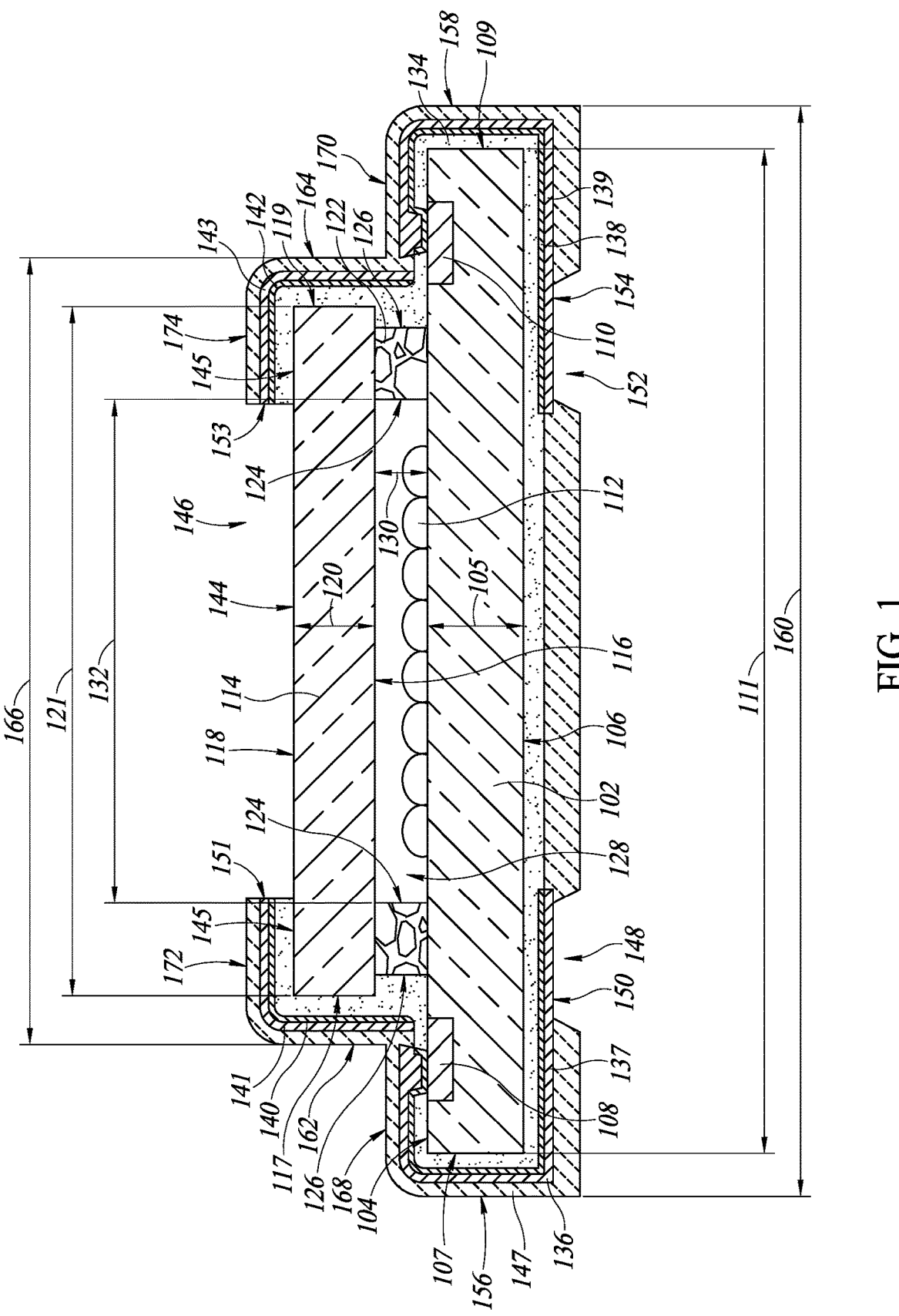
FIG. 1 illustrates a cross-sectional view of an embodiment of a sensor package of the present disclosure taken along lines A-A and B-B as shown in FIGS. 2 and 3, respectively.

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "top," "bottom," "upper," "lower," "left," and "right," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences and variation when a package is manufactured in the real world, as nothing can be made perfectly equal or perfectly the same. In other words, "substantially" means and represents that there may be some slight variation in actual practice and instead is made or manufactured within selected tolerances.

As used in this specification and the appended claims, the singular forms "a," "an," and "the" include plural referents unless the content clearly dictates otherwise.

While various embodiments are shown and described with respect to semiconductor die, it will be readily appreciated that embodiments of the present disclosure are not limited thereto. In various embodiments, the structures, devices, methods and the like described herein may be embodied in or otherwise utilized in any suitable type or form of semiconductor die, and may be manufactured utilizing any suitable semiconductor die and packaging technologies.

In at least one embodiment of a sensor package of the present disclosure, a doped resin is on respective surfaces and sidewalls of a sensor die and a transparent portion (e.g., glass or some other type of optically transmissive or transparent material such that light may readily pass through the transparent portion). The doped resin has a first thickness less than a second thickness of the sensor die and less than a third thickness of the transparent portion. At least one conductive layer is formed on the doped resin and has a fourth thickness less than the first thickness and the second thickness. At least one non-conductive layer is on and at least partially covers the conductive layer.

In at least one embodiment of a method of manufacturing the at least one embodiment of the sensor package of the present disclosure, the first conductive layer is formed by exposing the doped resin to a laser followed by a plating technique (e.g., electroplating, electroless plating, etc.). For example, the laser may be selectively moved along the doped resin activating an additive material (e.g., an inorganic non-conductive metallic compound) within the doped resin. Activating the additive material converts the additive material from a non-conductive state to a conductive state. This activation of the additive material forms at least a first layer of conductive material on the doped resin. Once the first layer of conductive material is formed, which may have a thickness in the range of a few hundred nanometers (nm) or a few micrometers ($\mu$m), a plating technique is performed forming a second layer of conductive material on the first layer of conductive material.

Generally, in conventional sensor packages a conventional molding compound has a thickness substantially equal to or greater than a summation of respective thicknesses of a conventional sensor die and a conventional transparent portion encased within the conventional molding compound. The conventional sensor die, the conventional transparent portion, and the conventional molding compound have coefficients of thermal expansion (CTE) that are all different from each other. These differences in CTEs may cause failures or defects including the conventional transparent portion cracking or the conventional sensor die delaminating from a conventional substrate coupled to the conventional sensor die. For example, if the conventional molding compound expands or contracts more than the conventional transparent portion due to a rapid increase or decrease in temperature, the molding compound may expand or contract more than the conventional transparent portion. This difference in expansion or contraction may cause a crack to propagate near an edge of the conventional transparent portion. Similarly, if the conventional molding compound expands or contracts more than the sensor die due to a rapid increase or decrease in temperature, the molding compound may expand or contract more than the conventional sensor die causing the conventional sensor die to start to delaminate from the conventional substrate near an edge of the conventional sensor die. These defects may result in the conventional sensor package failing or may result in the conventional sensor package functioning at a decreased capacity.

However, unlike the conventional molding compound in the conventional sensor package as discussed above, the doped resin of the at least one embodiment of the sensor package of the present disclosure has the first thickness that is less than the second thickness of the sensor die and less than the third thickness of the transparent portion. The effects of expansion or contraction of the doped resin is less than the effects of the expansion of the conventional molding compound that is thicker than the doped resin. For example, when the doped resin expands or contracts due to a rapid increase or decrease in temperature, stresses and strains applied to the transparent portion and the sensor die caused by this expansion or contraction of the doped resin is less relative to the expansion or contraction of the conventional molding compound. The effects due to the stresses and strains caused by the doped resin is less as there is less of the doped resin relative to the conventional molding compound in the conventional sensor package as discussed above.

The doped resin may have a coefficient of thermal expansion (CTE) different from the sensor die and the transparent portion. This difference in CTE between the doped resin, the transparent portion, and the sensor die of the sensor package may at least be partially mitigated by the thinness of the doped resin relative to respective thicknesses of the sensor die and the transparent portion. In other words, the thinness of the doped resin may reduce the likelihood of failures or defects including crack propagation or delamination of the sensor die from a substrate coupled to the sensor die.

At least some embodiments of sensor packages of the present disclosure may have an overall thickness in the range of ~250-$\mu$m to 650-$\mu$m, a width in the range of ~3-milimeters (mm) to 15-mm, and a length in the range of ~3-mm to 15-mm. Whereas the conventional sensor package as discussed above generally has dimensions greater than those of these sensor packages of the present disclosure. In other words, the embodiments of the sensor packages of the present disclosure are relatively thinner and smaller than conventional semiconductor sensor packages as discussed above. These at least some embodiments of sensor packages of the present disclosure do not include a plurality of wires to form electrical connections. The non-utilization of the plurality of wires reduces an overall profile or footprint of these embodiments of the sensor package of the present disclosure to be less than the conventional sensor package such that these sensor packages of the present disclosure take up less space within an electronic component (e.g., a smartphone, a tablet, a computer, etc.). The non-utilization of the plurality of wires reduces the overall profile or foot print of the embodiments of the sensor package as clearance does not need to be provided for forming electrical connections utilizing the plurality of wires. Instead, at least one conductive layer formed on the doped resin forms electrical connections within these embodiments of the sensor package.

In at least one embodiment of a sensor package of the present disclosure, the sensor package includes a sensor die having conductive pads on a first surface of the die, a support structure on the first surface, and a transparent portion on the support structure spaced apart from the first surface. The transparent portion covers and overlaps an optical sensor of the sensor die. The support structure is adjacent to and surrounds the optical sensor, and the optical sensor is in a cavity delimited by the first surface of the sensor die, the support structure, and the transparent portion. A doped resin including an additive material such as an inorganic noncon-ductive metallic compound is on and covers respective sidewalls of the transparent portion, the support structure, and the sensor die. The doped resin is on and covers a second surface of the sensor die opposite to the first surface of the sensor die and is on the first surface of the sensor die. The doped resin may be on a third surface of the transparent portion facing way from the first surface of the sensor die.

The embodiment of the sensor package further includes a first conductive layer extending along and on portions of the doped resin present at the first surface of the sensor die, the second surface of the sensor die, and a first sidewall extending from the first surface to the second surface. A second conductive layer extends along and on portions of the doped resin present at a second sidewall of the support structure and the third sidewall of the transparent portion. The second conductive layer may extend along and on portions of the doped resin present at the third surface of the transparent portion. The first conductive layer and the second conductive layer are separate and distinct from each other. In at least one alternative embodiment of a sensor package, the first and second conductive layers may be replaced by a single continuous conductive layer that extends along and on portions of the doped resin present at the first and second surface of the sensor die, and the first, second, and third sidewalls of the sensor die, the support structure, and the transparent portion.

A nonconductive layer extends along and on the doped resin, the first conductive layer, and the second conductive layer. The nonconductive layer covers the first conductive layer and the second conductive layer. The nonconductive layer includes openings that expose respective portions of the first conductive layer on the doped resin present at the second surface of the sensor die.

Figure 2:
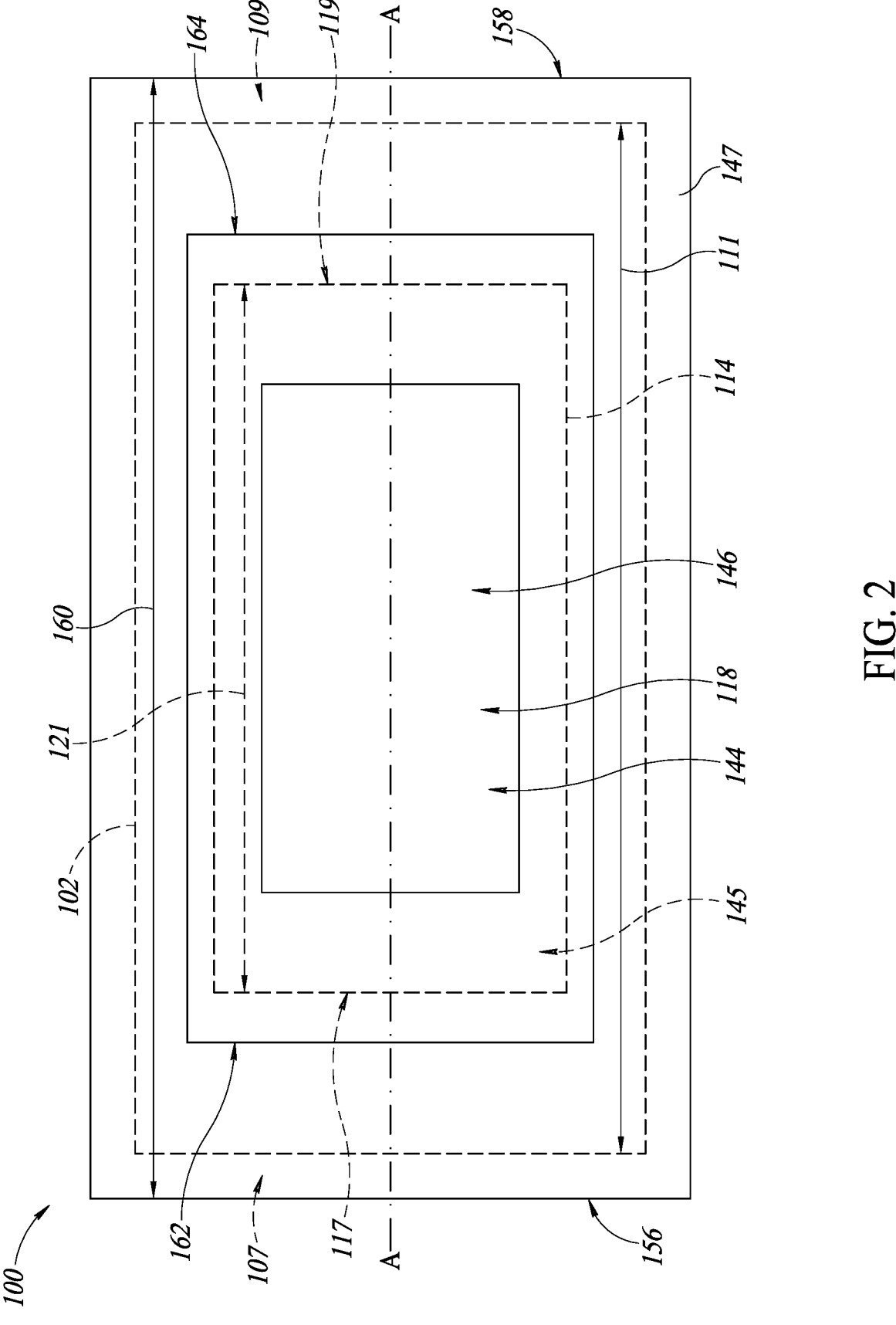
FIG. 2 illustrates a top plan view of the embodiment of the sensor package as shown in FIG. 1.
Figure 3:
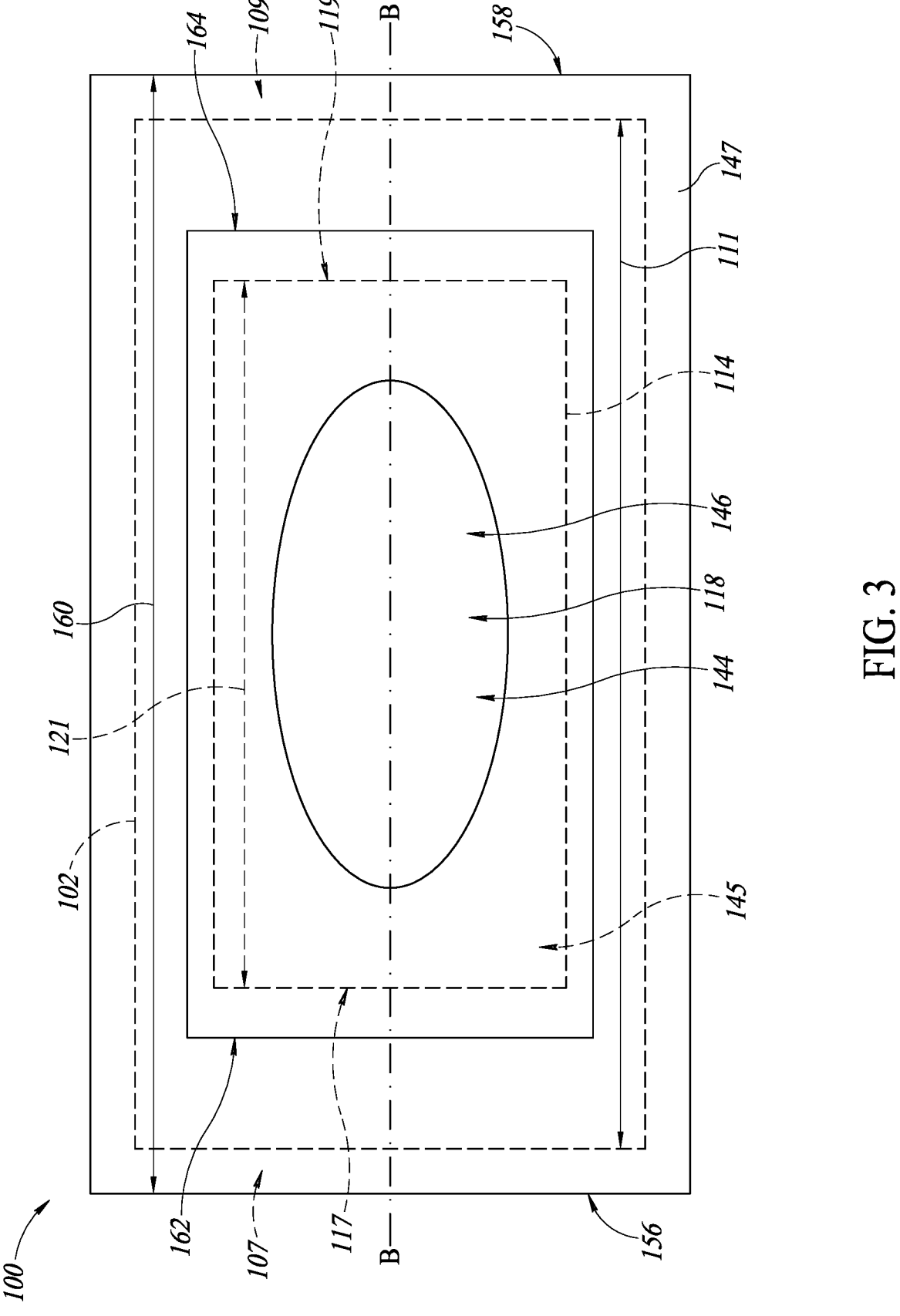
FIG. 3 illustrates a top plan view of an alternative embodiment of the sensor package as shown in FIG. 1.

FIG. 1 illustrates a cross-sectional view of a sensor package 100 taken along line A-A or line B-B as shown in FIGS. 2 and 3, respectively. The sensor package 100 includes a sensor die 102 having a first surface 104, a second surface 106 opposite to the first surface 104, a first sidewall 107 extending from the first surface 104 to the second surface 106, and a second sidewall 109 extending from the first surface 104 to the second surface 106. The second sidewall 109 being opposite to the first sidewall 107. The first and second sidewalls 107, 109 being transverse to the first and second surfaces 104, 106.

The sensor die 102 has a first thickness 105 extending from the first surface 104 to the second surface 106 in a first direction transverse to the first surface 104 and the second surface 106. The first and second sidewalls 107, 109 have the first dimension. The first thickness 105 may range from ~100-μm to 300-μm. The sensor die 102 includes a first dimension 111 extending from the first sidewall 107 to the second sidewall 109 in a second direction transverse to the first sidewall 107 and the second sidewall 109. The second direction is transverse to the first direction, and the second direction may be orthogonal to the first direction. The first dimension 111 may range from ~3-mm to 15-mm.

A first conductive pad 108 and a second conductive pad 110 of the sensor die 102 are at the first surface 104 of the sensor die 102. The first conductive pad 108 is at the left-hand side of the sensor package 100 and the second conductive pad 110 is at the right-hand side of the sensor package 100.

A sensor 112 of the sensor die 102 is at the first surface 104. The sensor 112 may be a light sensor configured to detect light, determine an intensity of the light, or detect or determine some other quantity or quality of the light that becomes incident on the sensor. For example, the sensor 112 may be an array of pixels configured to detect light that enters the package through a transparent portion 114 of the sensor package 100.

The transparent portion 114 includes a third surface 116 (e.g., an internal surface within the sensor package 100) facing the first surface 104 and overlapping the sensor 112, and a fourth surface 118 (e.g., an external surface exposed from the sensor package 100). The transparent portion 114 is an optically transmissive or transparent material such that light readily passes through the transparent portion 114 entering the sensor package 100 to be incident on the sensor 112. For example, the transparent portion 114 may be made of a glass material or some other suitable type of optically transmissive or transparent material. The transparent portion 114 further includes a third sidewall 117 extending from the third surface 116 to the fourth surface 118, and a fourth sidewall 119 extending from the third surface 116 to the fourth surface 118. The fourth sidewall 119 being opposite to the third sidewall 117, and the third and fourth sidewalls 117, 119 being transverse to the third and fourth surfaces 116, 118.

A second thickness 120 of the transparent portion 114 extends from the third surface 116 to the fourth surface in the first direction. The second thickness 120 may range from ~150-μm to 400-μm. A second dimension 121 of the transparent portion 114 extends from the third sidewall 117 to the fourth sidewall 119. The second dimension 121 extends in the second direction and may range from ~2-mm to 12-mm. In at least this embodiment, the second dimension 121 is less than the first dimension 111 such that the third and fourth sidewalls 117, 119 of the transparent portion 114 are spaced inwardly from the first and second sidewalls 107, 109 of the sensor die 102.

A support structure 122 extends from the first surface 104 to the third surface 116. The support structure 122 couples the transparent portion 114 to the sensor die 102 such that the transparent portion 114 is suspended over the sensor 112.

The support structure 122 includes inner sidewalls 124 facing inward towards the sensor 112, and outer sidewalls 126 facing away from the sensor 112. The support structure 122 may be an epoxy bead or some other type standoff, support, or spacer that supports and separates the transparent portion 114 from the sensor die 102.

A cavity 128 is between the first surface 104 and the third surface 116 and is surrounded by the support structure 122. The first surface 104, the third surface 116, and the internal sidewalls 124 delimit the cavity 128, and the cavity 128 contains the sensor 112 such that the sensor 112 is sealed from an external environment outside the sensor package 100, which protects the sensor 112 from debris or external forces. A third thickness 130 of the cavity 128 extends from the first surface 104 to the third surface 116 in the first direction. The third thickness 130 may be in the range from ~10-μm to 50-μm. The third thickness 130 is less than the first thickness 105 and less than the second thickness 120. A third dimension 132 extends from the inner sidewall 124 at the left-hand side of the cavity 128 to the inner sidewall 124 at the right-hand side of the cavity 128. The third dimension 132 may be in the range from ~1-mm to 10-mm. The third dimension 132 is less than the first dimension 111 and is less than the second dimension 121.

A layer of a doped resin 134 is on the first and second surfaces 104, 106, is on the first and second sidewalls 107, 109, is on the outer sidewalls 126, is on the third and fourth sidewalls 117, 119, and is on the fourth surface 118. The doped resin 134 completely covers the second surface 106 of the sensor die 102, completely covers the first and second sidewalls 107, 109, and partially covers the first surface 104 of the sensor die 102 such that the doped resin 134 covers a peripheral region 145 of the first surface 104. The doped resin 134 completely covers the outer sidewalls 126 of the support structure 122 and the third and fourth sidewalls 117, 119 of the transparent portion 114. The doped resin 134 partially covers the fourth surface 118 of the transparent portion 114 such that the doped resin 134 covers a peripheral region 145 of the fourth surface 118 and leaves a central region 144 of the fourth surface 118 uncovered. The doped resin 134 is doped with an additive material (e.g., an inorganic non-conductive metallic compound, which may include a metal material) that is activated by a laser. When the additive material is activated by being exposed to a laser, the additive material is converted from the inorganic non-conductive metallic compound or material to a conductive compound or material (e.g., a conductive layer, which may be a metal layer). The doped resin 134 is relatively thin as compared to the sensor die 102 and the transparent portion 114. For example, the doped resin 134 may have a thickness that ranges from ~15-μm to 30-μm. The thickness of the doped resin 134 remains substantially the same extending along the doped resin 134 from the second surface 106, the first and second sidewalls 107, 109, the first surface 104, the outer sidewalls 126, the third and fourth sidewalls 117, 119, and the fourth surface 118.

A first conductive layer 136 extends along portions of the doped resin 134 present on the second surface 106, the first sidewall 107, and the first surface 104. A second conductive layer 137 extends along the first conductive layer 136. In some embodiments, the first and second layers may be made of the same conductive material, or, in some alternative embodiments, the first and second conductive layers 136, 137 may be made of different conductive materials. The first conductive layer 136 extends through the doped resin 134 to the first conductive pad 108 such that the first conductive layer 136 is coupled to the first conductive pad 108.

A third conductive layer 138 extends along portions of the doped resin 134 present on the second surface 106, the second sidewall 109, and the first surface 104. A fourth conductive layer 139 extends along the third conductive layer 138. In some embodiments, the third and fourth conductive layers 138, 139 may be made of the same conductive material, or, in some alternative embodiments, the third and fourth conductive layers 138, 139 may be made of different conductive materials. The third conductive layer 138 extends through the doped resin 134 to the second conductive pad 110 such that the second conductive layer 137 is coupled to the second conductive pad 110.

The first, second, third and fourth conductive layers 138, 139 may terminate on portions of the doped resin 134 on the second surface 106 of the sensor die 102. The first, second, third and fourth conductive layers 138, 139, respectively, may terminate on or at a location adjacent to the first and second conductive pads 108, 110, respectively.

A fifth conductive layer 140 extends along portions of the doped resin 134 on the outer sidewall 126 of the support structure 122 at the left-hand end of the cavity 128, the third sidewall 117, and the fourth surface 118. A sixth conductive layer 141 extends along the fifth conductive layer 140. In some embodiments, the fifth and sixth conductive layers 140, 141 may be made of the same conductive material, or, in some alternative embodiments, the fifth and sixth conductive layers 140, 141 may be made of different conductive materials. The fifth and sixth conductive layers 140, 141 terminate on a portion of the doped resin 134 present on the first surface 104 of the sensor die 102, and terminate on a portion of the doped resin 134 present on the peripheral region 145 of the fourth surface 118 of the transparent portion 114. The fifth and sixth conductive layers 140, 141 cover at least a portion of the peripheral region 145 of the fourth surface 118 of the doped resin 134.

A seventh conductive layer 142 extends along portions of the doped resin 134 on the outer sidewall 126 of the support structure 122 at the right-hand end of the cavity 128, the fourth sidewall 119, and the fourth surface 118. An eighth conductive layer 143 extends along the seventh conductive layer 142. In some embodiments, the seventh and eighth conductive layers 142, 143 may be made of the same conductive material, or, in some alternative embodiments, the seventh and eighth conductive layers 142, 143 may be made of different conductive materials. The seventh and eighth conductive layers terminate on a portion of the doped resin 134 on the first surface 104 of the sensor die 102, and terminate on a portion of the doped resin 134 present on the peripheral region 145 of the fourth surface 118 of the transparent portion 114. The fourth conductive layer 139 covers at least a portion of the peripheral region 145 of the fourth surface 118 of the doped resin 134.

The third and fourth conductive layers 138, 139 may be portions of a multi-layer conductive layer that surrounds all sidewalls of the transparent portion 114 and completely covers the peripheral region 145 of the transparent portion 114 adjacent to edges of the transparent portion 114. The multi-layer conductive layer may be an electromagnetic shield (e.g., barrier), may be a light shield (e.g., barrier), or both. When the third and fourth conductive layers 138, 139 are portions of the light shield, the third and fourth conductive layers 138, 139 are opaque and absorb light that becomes incident on the third and fourth conductive layers 138, 139. The third and fourth conductive layers 138, 139 stop any light entering the transparent portion 114 through the third and fourth sidewalls 117, 119 of the transparent portion 114 and the peripheral region 145 of the fourth surface 118 of the transparent portion 114. In other words, when the third and fourth conductive layers 138, 139 are portions of the light shield, the light shield stops any light from entering the sensor package 100 through the sidewalls of the transparent portion 114 or through the peripheral region 145 of the fourth surface 118 of the transparent portion 114.

In an alternative embodiment of the sensor package 100, the third and fourth conductive layers 138, 139 may be separate and distinct from each other such that both may be separate and distinct electromagnetic shields (e.g., barriers), may be separate and distinct light shields (e.g., barriers), or may be both separate and distinct individual electromagnetic and light shields.

In this embodiment of the sensor package 100 as shown in FIG. 1, the first and second conductive layers 136, 137 are separate and distinct from the third and fourth conductive layers 138, 139. In some alternative embodiments, the first conductive layer 136 may be coupled to the third conductive layer 138 such that the first and third conductive layers 136, 138 are a multi-layer conductive layer. In some alternative embodiments, the second conductive layer 137 may be coupled to the fourth conductive layer 139 such that the second and fourth conductive layers 137, 139 are a multi-layer conductive layer. In some alternative embodiments, the first, second, third, and fourth conductive layers 136, 137, 138, 139 may all be coupled together such that the first, second, third, and fourth conductive layers 136, 137, 138, 139 are all portions of a multi-layer conductive layer.

A non-conductive layer 147 is on the first, second, third, and fourth conductive layers 136, 137, 138, 139 and is on the doped resin 134. The non-conductive layer 147 abuts and covers the second and fourth conductive layers 137, 139. The non-conductive layer 147 may be a passivation layer, a re-passivation layer, an insulating layer, a solder resist layer, a mask layer, or some other suitable type of non-conductive layer 147 that may electrically isolate the first and second conductive layers 136, 137 from the fifth and sixth conductive layers 140, 141, and electrically isolate the third and fourth conductive layers 138, 139 from the seventh and eighth conductive layers 142, 143. These respective conductive layers may be electrically isolated from each other to avoid electrical crosstalk between the respective conductive layers to reduce the likelihood of short-circuiting occurring within the sensor package 100.

A first opening 146 is present at the fourth surface 118 of the transparent portion 114. The first opening 146 extends past the doped resin 134, the first conductive layer 136, the second conductive layer 137, and the non-conductive layer 147 exposing a central region 144 of the fourth surface 118 of the transparent portion 114. The central region 144 of the fourth surface 118 is surrounded by the peripheral region 145 of the transparent portion 114.

The first opening 146 is delimited by sidewalls 151, 153. In this embodiment of the sensor package 100, the sidewall at the left-hand side of the first opening 146 includes surfaces of the doped resin 134, the fifth and sixth conductive layers 140, 141, and the non-conductive layer 147, and these surfaces are coplanar and flush with each other. In this embodiment of the sensor package 100, the sidewall at the right-hand side of the first opening 146 includes surfaces of the doped resin 134, the seventh and eighth conductive layers 142, 143, and the non-conductive layer 147, and these surfaces are coplanar and flush with each other. In some alternative embodiments of the sensor package 100, the surfaces of the doped resin 134, the fifth and sixth conductive layers 140, 141, and the seventh and eighth conductive layers 142, 143 may be covered by the non-conductive layer 147 such that the sidewalls are surfaces of only the non-conductive layer 147.

A second opening 148 is present at a portion of the second conductive layer 137 at the second surface 106 of the sensor die 102. The second opening 148 extends through the non-conductive layer 147 and exposes a surface 150 of the second conductive layer 137. A third opening 152 is present at a portion of the fourth conductive layer 139 at the second surface 106 of the sensor die 102. The third opening 152 extends through the non-conductive layer 147 and exposes a surface 154 of the fourth conductive layer 139. The second and third openings 148, 152 may be ones of a plurality of openings that expose ones of a plurality of conductive layers similar to the first, second, third and fourth conductive layers 136, 137, 138, 139. In other words, the plurality of openings present at the second surface 106 of the sensor die 102 may expose corresponding ones of the plurality of conductive layers.

The surfaces 150, 154, respectively, of the second and fourth conductive layers 137, 139, respectively, may be bond surfaces, contact surfaces, or some other type of surface that may be utilized to mount or couple the sensor package 100 to an external component such as a printed circuit board (PCB). For example, solder balls may be coupled to the surfaces 150, 154, respectively, of the second and fourth conductive layers 137, 139, which are then also coupled to contact pads or bond pads of the PCB.

A first external sidewall 156 of the non-conductive layer 147 is at the left-hand side of FIG. 1 and a second external sidewall 158 of the non-conductive layer 147 is at the right-hand side of FIG. 1. The first external sidewall 156 is opposite to the second external sidewall 158. A fourth dimension 160 extends from the first external sidewall 156 to the second external sidewall 158 in the second direction. The fourth dimension 160 is greater than the first dimension, the second dimension 121, and the third dimension 132. The fourth dimension 160 may range from ~3-mm to 15-mm.

A third external sidewall 162 of the non-conductive layer 147 is spaced inwardly to the right from the first external sidewall 156, and a fourth external sidewall 164 of the non-conductive layer 147 is spaced inwardly to the left from the second external sidewall 158. The third external sidewall 162 is opposite to the fourth external sidewall 164. A fifth dimension 166 extends from the third external sidewall 162 to the fourth external sidewall 164 in the second direction. The fifth dimension 166 is less than the first dimension and less than the fourth dimension 160. The fifth dimension 166 may range from ~2-mm to 12-mm.

The sensor package 100 has a staircase like structure due to the stacked configuration of the sensor die 102 and the transparent portion 114. Respective surfaces 168, 170, 172, 174 of portions of the non-conductive layer 147 aligned with and on the first surface 104 of the sensor die 102 and the fourth surface 118 of the transparent portion 114 may be referred to as tread surfaces. Respective sidewalls 156, 158, 162, 164 of portions of the non-conductive layer 147 aligned with and on the first, second, third, and fourth sidewalls 107, 109, 117, 119 may be referred to a riser surfaces.

FIG. 2 illustrates a top plan view of an embodiment of the sensor package 100. In this embodiment, the transparent portion 114 has a rectangular size and shape when viewed in the top plan. The first opening 146 is within a boundary defined by edges of the transparent portion 114 such that the first opening 146 is spaced inwardly from the boundary. The first opening 146 has a rectangular size and shape when viewed in the top plan view.

The respective surfaces 168, 170 of the portions of the non-conductive layer 147 aligned with and on the first surface 104 of the sensor die 102 may be ones of a plurality of surfaces that are around and laterally spaced outwardly from the transparent portion 114. The respective surfaces 172, 174 may be ones of a plurality of surfaces that are around and laterally spaced outwardly from the first opening 146.

FIG. 3 illustrates a top plan view of an embodiment of the sensor package 100. In this embodiment, the first opening 146 has an oval size and shape when viewed in the top plan view. In view of the embodiment of the first opening 146 as shown in FIGS. 2 and 3, the first opening 146 may have a diamond size and shape, a trapezoid size and shape, or some other type of size and shape.

Figure 4:
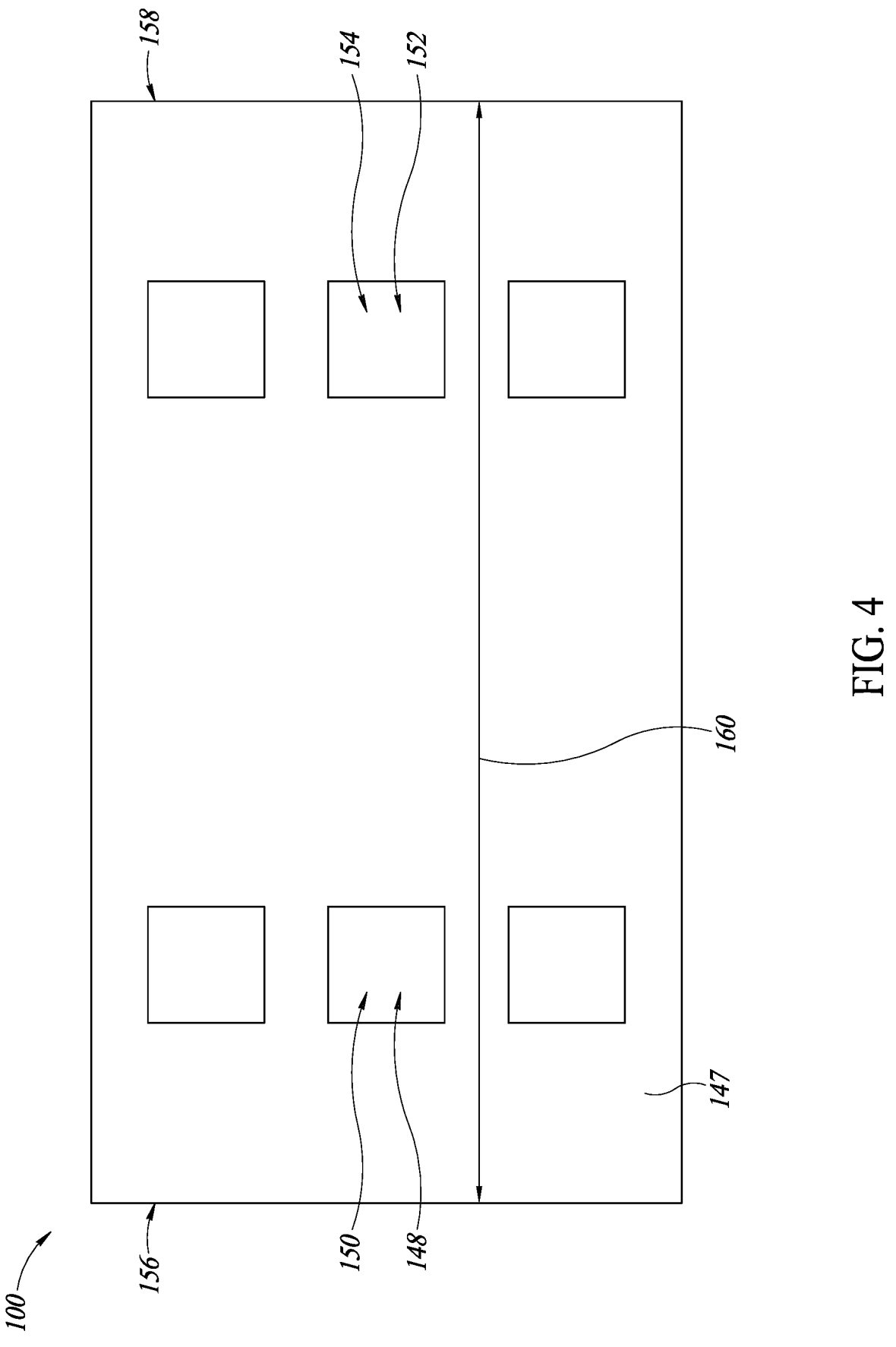
FIG. 4 illustrates a bottom plan view of the embodiment of the sensor package as shown in FIG. 1.

FIG. 4 illustrates a bottom plan view of an embodiment of the sensor package 100. The surfaces 150, 154, respectively, of the first and second conductive layers 136, 137, respectively, are ones of a plurality of conductive pads that are exposed at a first side of the sensor package 100 opposite to a second side of the sensor package at which the first opening 146 is present. In this embodiment, the plurality of conductive pads has three rows and two columns of conductive pads. In some other embodiments, the plurality of conductive pads may have four rows and three columns, two rows and two columns or some other number of rows and columns. In this embodiment, the plurality of conductive pads includes six conductive pads. In some other embodiments, the plurality of conductive pads may include one conductive pad, two conductive pads, three conductive pads, or any other number of conductive pads.

Figure 5:
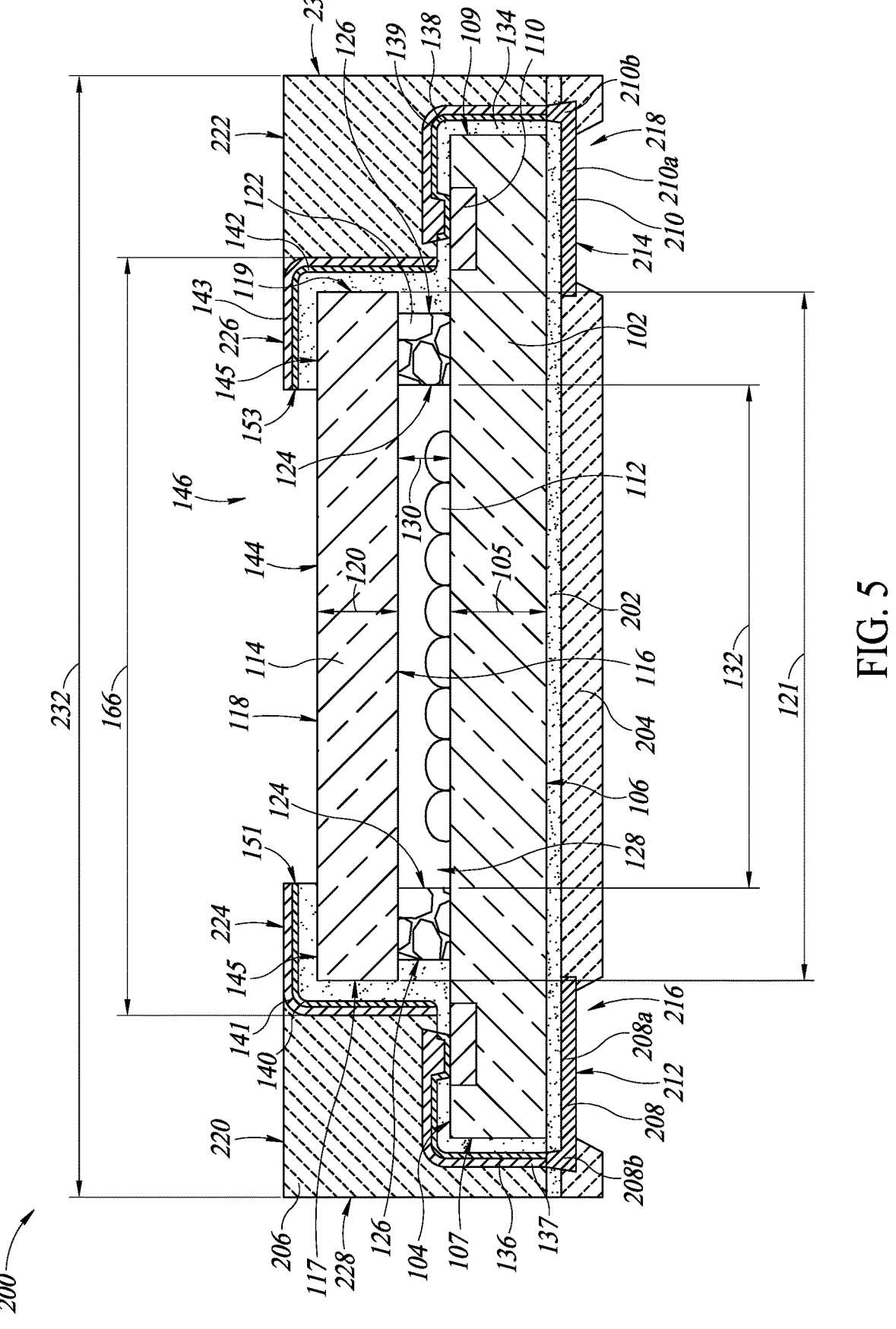
FIG. 5 illustrates a cross-sectional view of an alternative embodiment of a sensor package of the present disclosure.

FIG. 5 is a cross-sectional view of an alternative embodiment of a sensor package 200. Features in the sensor package 200 as shown in FIG. 5 that are the same or similar to the features of the sensor package 100 as shown in FIG. 1 will have the same reference numerals. For the sake of brevity and simplicity of the present disclosure, the details of these similar or same features will at least not be reproduced fully herein.

Unlike the sensor package 100 as shown in FIG. 1, the sensor package 200 as shown in FIG. 5 includes a first non-conductive layer 202, a second non-conductive layer 204, and a third non-conductive layer 206 as well as a ninth conductive layer 208 and a tenth conductive layer 210.

The first non-conductive layer 202 is on the second surface 106 of the sensor die 102, and abuts the second surface 106 of the sensor die 102. The first non-conductive layer 202 may be a passivation layer, a re-passivation layer, an insulating layer, or a solder resist layer, or some other suitable type of non-conductive layer. Unlike the sensor package 100 as shown in FIG. 1, the doped resin 134 as shown in FIG. 5 does not extend along or on the second surface 106 of the sensor die 102. Instead, the doped resin 134 terminates on the first non-conductive layer 202.

The ninth conductive layer 208 is on the first non-conductive layer 202 and extends into the non-conductive layer to the first and second conductive layers 136, 137 such that the ninth conductive layer 208 is coupled to the first and second conductive layers 136, 137. The ninth conductive layer 208 includes a contact portion 208a and a via portion 208b. The via portion extends from the contact portion to the first and second conductive layers 136, 137 such that the contact portion is in electrical communication with the first and second conductive layers 136, 137 through the via portion.

The tenth conductive layer 210 is on the first non-conductive layer 202 and extends into the non-conductive layer to the third and fourth conductive layers 138, 139 such that the tenth conductive layer 210 is coupled to the third and fourth conductive layers 138, 139. The tenth conductive layer 210 includes a contact portion 210a and a via portion 210b. The via portion extends from the contact portion to the first and second conductive layers 136, 137 such that the contact portion is in electrical communication with the first and second conductive layers 136, 137 through the via portion.

In some embodiments, the ninth and tenth conductive layers 208, 210 may be made of the same conductive material, or, in some alternative embodiments, the ninth and tenth conductive layers 208, 210 may be made of different conductive material relative to each other. In some embodiments, the ninth and tenth conductive layers 208, 210 may each be made of multiple layers of conductive material coupled to each other such that electrical signals may be passed to and from the sensor die 102 within the sensor package 200.

The second non-conductive layer 204 is on the first non-conductive layer 202 and is on the ninth and tenth conductive layers 208, 210. The second non-conductive layer 204 may cover peripheral regions ninth and tenth conductive layers 208, 210 while leaving contact surfaces 212, 214 at central regions exposed by corresponding openings 216, 218 in the second non-conductive layer 204. The contact surfaces 212, 214 are utilized to mount or bond the sensor package 200 to an electronic component external to the sensor package 200 such as a printed circuit board (PCB). For example, solder balls may be formed on the contact surfaces 212, 214 and then utilized to couple the sensor package 200 to the PCB. The contact surfaces 212, 214 may be referred to as contact pads, bond pads, or some other type of suitable conductive structure for coupling the sensor package 200 to the electronic component.

The third non-conductive layer 206 is on the second, fourth, sixth, and eighth conductive layers 137, 139, 141, 143, is on the doped resin 134, and is on the first non-conductive layer 202. The third non-conductive layer 206 may be a molding compound, a resin, an epoxy, or some other suitable type of non-conductive layer. External surfaces 220, 222 of the third non-conductive layer 206 are substantially coplanar with external surfaces 224, 226 of the sixth and eighth conductive layers 141, 143. In some embodiments, when the sixth and eighth conductive layers 141, 143 are a single, unitary conductive layer, the external surfaces 224, 226 are a single, unitary external surface. In some embodiments, when portions of the third non-conductive layer 206 on the left-hand side and the right-hand side of the transparent portion 114 are a single, unitary non-conductive layer, the external surfaces 220, 222 of the third non-conductive layer 206 are a single, unitary conductive layer.

A first sidewall 228 is at the left-hand side of the sensor package 200, and a second sidewall 230 is at the right-hand side of the sensor package 200 and is opposite to the first sidewall 228. The first and second sidewalls 228, 230 include respective surfaces of the first, second, and third non-conductive layers 202, 204, 206 that are coplanar and flush with each other.

In this embodiment of the sensor package 200, the sidewalls 151 delimiting the first opening 146 do not include surfaces of the third non-conductive layer 206, and, instead, include surfaces of the doped resin 134 and the fifth, sixth, seventh, and eight conductive layers 140, 141, 142, 143. In some alternative embodiments, the sidewalls 151 may include surfaces of the third non-conductive layer 206 such that the third non-conductive layer 206 is on and covers the external surfaces 224, 226 of the sixth and eighth conductive layers 141, 143. In some alternative embodiments, the third non-conductive layer 206 may cover the surfaces 224, 226 of the sixth and eighth conductive layers 141, 143 as well as sidewalls adjacent to the first opening 146 delimiting the first opening 146 such that the first opening 146 is instead delimited by surfaces of the third non-conductive layer 206.

A sixth dimension 232 extends from the first sidewall 228 to the second sidewall 230. The sixth dimension is greater than the second dimension of the transparent portion 114 and is greater than the fifth dimension 166 of the sensor die 102. In this embodiment, the first, second, and third non-conductive layers 202, 204, 206 include the sixth dimension.

The first, second, and third non-conductive layers 202, 204, 206 may be selected having CTEs that are relatively low such that any expansion or contraction within the first, second, and third non-conductive layers 202, 204, 206 have little to no effect on the sensor die 102 or the transparent portion 114. In other words, the effects of expansion or contraction due to rapid changes in temperature in the first, second, and third non-conductive layers 202, 204, 206 are minimal such that the expansion and contraction do not result in the transparent portion 114 cracking or the sensor die 102 delaminating from the first non-conductive layer 202.

Figure 6:
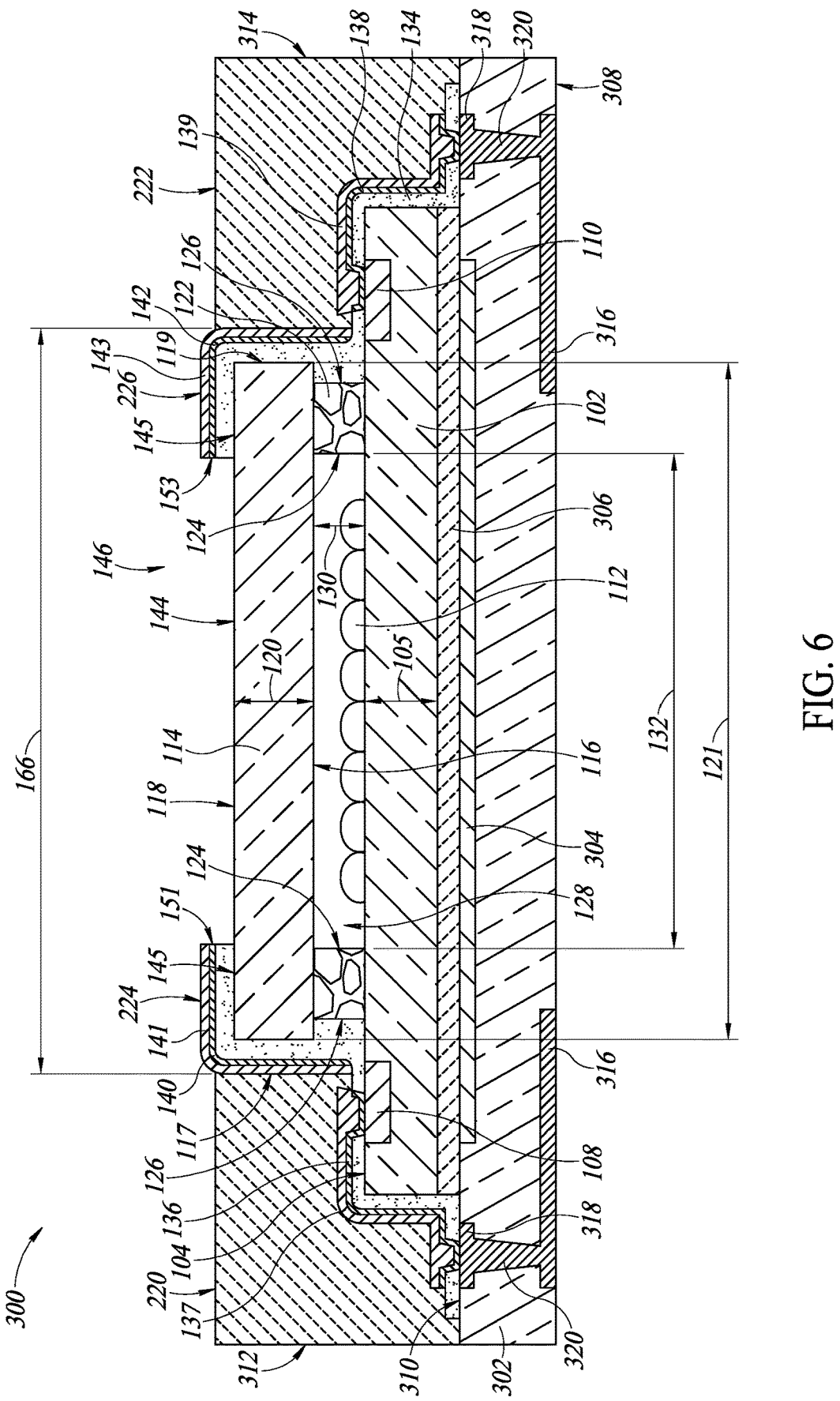
FIG. 6 illustrates a cross-sectional view of an alternative embodiment of a sensor package of the present disclosure.

FIG. 6 a cross-sectional view of an alternative embodiment of a sensor package 300. Features in the sensor package 300 as shown in FIG. 6 that are the same or similar to the features of the sensor packages 100, 200 as shown in FIGS. 1 and 5 will have the same reference numerals. For the sake of brevity and simplicity of the present disclosure, the details of these similar or same features will at least not be reproduced fully herein.

Unlike the sensor package 200 as shown in FIG. 5, the sensor package 300 as shown in FIG. 6 includes a substrate 302 and does not include the first and second non-conductive layers 202, 204 of the sensor package 200 as shown in FIG. 5. Instead, the substrate 302 replaces the first and second non-conductive layers 202, 204 as shown in FIG. 5. The substrate 302 may be a silicon substrate. The substrate 302 may be a multi-layer substrate that includes a plurality of layers such as passivation layers, re-passivation layers, a core layer, or some other suitable type of layer that may be a layer of the substrate 302.

A conductive pad 304 of the substrate 302 is coupled to the sensor die 102 by an adhesive 306, which may be a die attach film, a glue, a conductive paste (e.g., solder, silver, etc.), or some other suitable type of adhesive for coupling the sensor die 102 to the conductive pad 304, which may be a die pad that may assist in dissipating heat in the sensor die 102 when the sensor die 102 is powered. Alternatively, the conductive pad 304 may be in electrical communication with a contact pad exposed from an external surface 308 of the substrate 302.

Unlike the sensor package 200 as shown in FIG. 5, the surfaces 220, 222 of the third non-conductive layer 206 are recessed below the surfaces 224, 226 of the sixth and eighth conductive layers 141, 143. In other words, the third non-conductive layer 206 extends from an internal surface 310 of the substrate 302 and terminates before extending to the surfaces of the sixth and eighth conductive layers 141, 143. The internal surface 310 of the substrate 302 is opposite to the external surface 308 of the substrate 302.

Unlike the sensor package 200 as shown in FIG. 5, a first sidewall 312 at the left-hand side of the sensor package 300 includes surfaces of the third non-conductive layer 206 and the substrate 302 that are substantially coplanar and flush with each other. A second sidewall 314 at the right-hand side of the sensor package 300 includes surfaces of the third non-conductive layer 206 and the substrate 302 are substantially coplanar and flush with each other.

Unlike the sensor package 100 as shown in FIG. 1, the doped resin 134 does not extend along or on the second surface 106 of the sensor die 102. Instead, the doped resin 134 terminates at and on the internal surface 310 of the substrate 302. The doped resin 134 extends along the internal surface 310 of the substrate 302 and terminates before reaching the first and second sidewalls 312, 314 of the sensor package 300.

A plurality of first contact pads 316 are at the external surface 308 of the substrate 302 and a plurality of second contact pads 318 are at the internal surface 310 of the substrate 302. Ones of the plurality of first contact pads 316 are coupled to corresponding ones of the second contact pads 318. The plurality of first contact pads 316 are coupled to the plurality of second contact pads 318 by a plurality of conductive vias 320. For example, ones of the plurality of conductive vias 320 extend from ones of the plurality of first contact pads 316 to corresponding ones of the plurality of second contact pads 318. The plurality of first contact pads 316, the plurality of second contact pads 318, and the plurality of conductive vias 320 form electrical connections or pathways along which electrical signals may pass to and from the sensor die 102 or to and from the sensor package 300 to external electronic components to which the sensor package 300 is in electrical communication.

Figure 7:
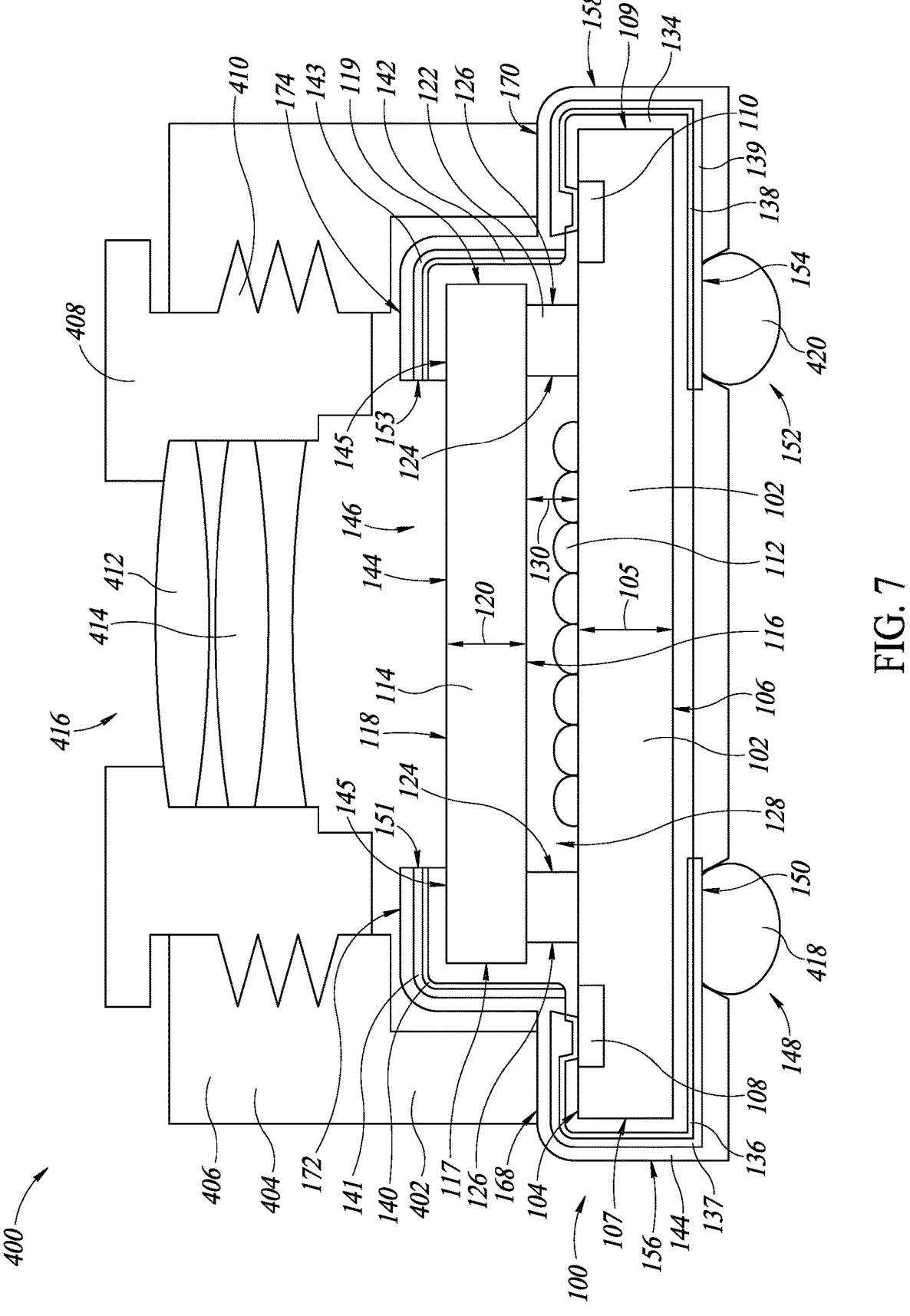
FIG. 7 illustrates a cross-sectional view of the embodiment of the sensor package as shown in FIG. 1 with a lens component on the embodiment of the sensor package.

FIG. 7 is a cross-sectional view of a sensor package 400 in which a lens reception portion 402 is coupled to the sensor package 100 as shown in FIG. 1. The lens reception portion 402 includes a support portion 404 that is coupled to the respective surfaces 170, 172 as shown in FIG. 1 and a threaded portion 406 that is coupled to the support portion 404 and suspended over the sensor package 100. The threaded portion 406 receives a lens component 408, which includes a threaded structure 410 that receives a first lens 412 and a second lens 414. The first and second lenses 412, 414 are coupled to the threaded structure 410 and are within an opening 416 in the threaded structure 410. The first lens 412 and the second lens 414 may be convex lenses that focus a beam of light on the sensor 112 as light photons pass through the first lens 412 and the second lens 414. In some alternative embodiments, there may be only one lens in the opening 416 of the threaded structure 410. In some alternative embodiments, there may be more than two lenses (e.g., three, four, etc.) within the opening 416 of the threaded structure 410. The first lens 412 and the second lens 414 are suspended over and aligned with the first opening 146 that exposes the fourth surface 118 of the transparent portion 114 such that light that passes through the first lens 412 and the second lens 414 is directed through the first opening 146 into the fourth surface 118 of the transparent portion 114 to reach the sensor 112. The second lens 414 is closer to the transparent portion 114 than the first lens 412.

A first solder ball 418 is coupled to the surface of the second conductive layer 137 and a second solder ball 420 is coupled to the surface of the fourth conductive layer 139. The first and second solder balls 418, 420 may be ones of a plurality of solder balls that are coupled to other conductive layers not readily visible in the cross-sectional view as shown in FIG. 7.

FIGS. 8A-8E are directed to an embodiment of a method of manufacturing the sensor package 200 as shown in FIG. 5. FIGS. 8A-8E illustrate cross-sectional views during the embodiment of the method of manufacturing the sensor package 200 as shown in FIG. 5. For simplicity and brevity of the present disclosure, the following discussion with respect to the method of manufacturing will be focused on the sensor die 102 at the left-hand side as shown in FIGS. 8A-8E. However, it will be readily appreciated that the following discussion will also apply to the method of manufacturing with respect to the sensor die 102 at the right-hand side of FIGS. 8A-8E.

The two sensor die 102 as shown in FIGS. 8A-8E may be ones of an array of the sensor die 102 that are temporarily coupled to a first support 500 by an adhesive 502, which may be a temporary adhesive, for forming multiple of the sensor package 200 as shown in FIG. 5.

Figure 8A:
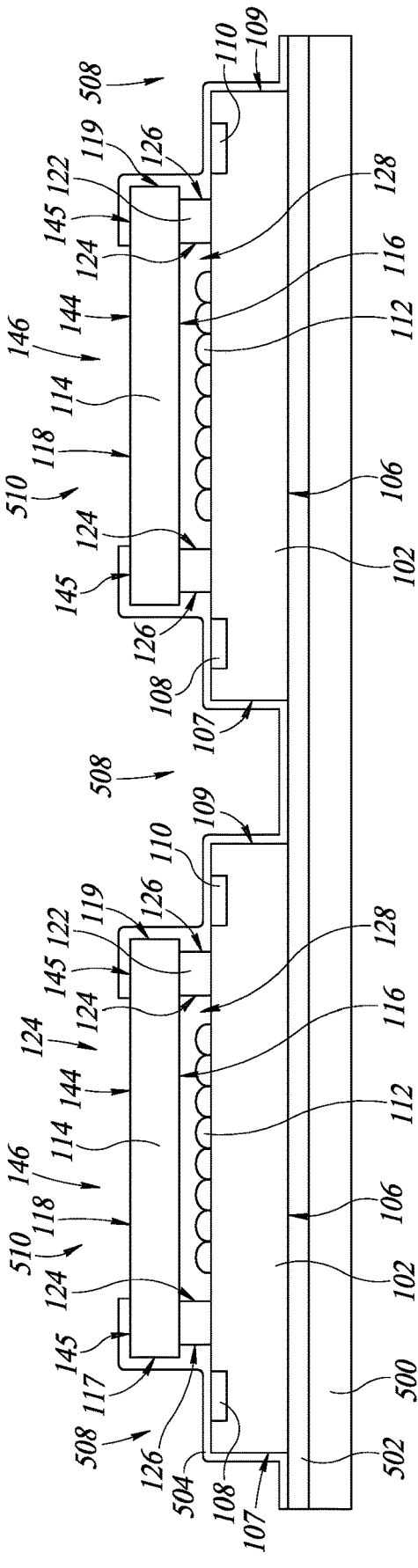
FIGS. 8A-8E illustrate cross-sectional views of an embodiment of a method of manufacturing the alternative embodiment of the sensor package as shown in FIG. 4.

FIG. 8A illustrates a step of the method of manufacturing the sensor package 200 in which the sensor die 102 is coupled to the first support 500 by the adhesive 502. For example, the sensor die 102 may be coupled to the adhesive 502 by placing the sensor die 102 on the adhesive 502 utilizing a pick-and-place machine. The adhesive 502 may be a temporary adhesive such that the sensor die 102 may later be removed from the first support 500.

After the sensor die 102 has been coupled to the first support 500 by the adhesive 502, which is temporary, the support structure 122 is formed on the first surface 104 of the sensor die 102. The support structure 122 may be formed by an extrusion formation technique, injection formation technique, a compression formation technique, or some other like formation or deposition technique. For example, an epoxy or a resin material may be extruded onto the first surface 104 of the sensor die 102 in a selective manner to avoid covering the sensor 112 with the epoxy or resin material such that the epoxy or resin material is around or surrounds the sensor 112. After being selectively applied, the epoxy or resin material is allowed to cure and harden to form the support structure 122. In an alternative embodiment, the support structure 122 may be formed utilizing a molding tool and injecting an epoxy or resin material into the molding tool forming the support structures 122. Each one of the support structures 122 surrounding a corresponding one of the sensors 112 of a corresponding one of the sensor die 102.

After the plurality of the support structures 122 are formed, the transparent portion 114 is coupled to at least one of the support structures 122. For example, when the corresponding support structure 122 is an epoxy or a resin material that is extruded onto the first surface 104, the transparent portion 114 may be coupled to the support structure 122 by placing the transparent portion 114 on the support structure 122 before the support structure 122 is allowed to cure and harden. In an alternative embodiment, the support structure 122 may be formed on the third surface 116 of the transparent portion 114 and before the epoxy or resin material completely cures and hardens, the support structure 122 and the transparent portion 114 are placed on the first surface 104 of the sensor die 102. At which time the support structure 122 is placed on the first surface 104 of the sensor die 102 along with the transparent portion 114 by a pick and place machine. The support structure 122 is then allowed to finish curing and hardening such that the support structure 122 is coupled to the first surface 104 of the sensor die 102, and the support structure 122 couples the transparent portion 114 to the first surface 104 of the sensor die 102.

After the support structure 122 is formed and the transparent portion 114 is coupled to the support structure 122, a layer of doped resin 504 is formed on respective surfaces of the sensor die 102. The layer of doped resin 504 may also be formed on portions of the adhesive 502 that have not been covered by the plurality of sensor die 102. The layer of the doped resin 504 may be formed by a sputtering technique, a spraying technique, or some other type of depositing technique for forming the layer of doped resin 504. The layer of doped resin 504 may have a thickness substantially equal to or greater than ~15-µm.

The layer of doped resin 504 is formed to include the first opening 146 exposing the surface of the transparent portion 114. The first opening 146 may be one of a plurality of first openings 146 that exposes which each one of the first openings 146 exposes a corresponding surface of the transparent portions 114. In an alternative embodiment of the method of manufacturing, a temporary protective layer may be present on the surfaces of the plurality of transparent portions 114 and fills the first openings 146. The temporary protection layer may be configured to protect the surfaces of the transparent portions 114 during further steps of the alternative embodiment of the method of manufacturing, and the temporary protection layer is removed at a later step to form the first openings 146 and expose the surfaces of the transparent portions 114. The first openings 146 may correspond to the first opening 146 as shown in FIG. 6.

The layer of doped resin 504 is utilized to form the doped resin in the sensor package 200 as shown in FIG. 5. The layer of doped resin 504 is doped with an additive material (e.g., inorganic non-conductive metallic compound, which may include a metal material) that is non-conductive.

Figure 8B:
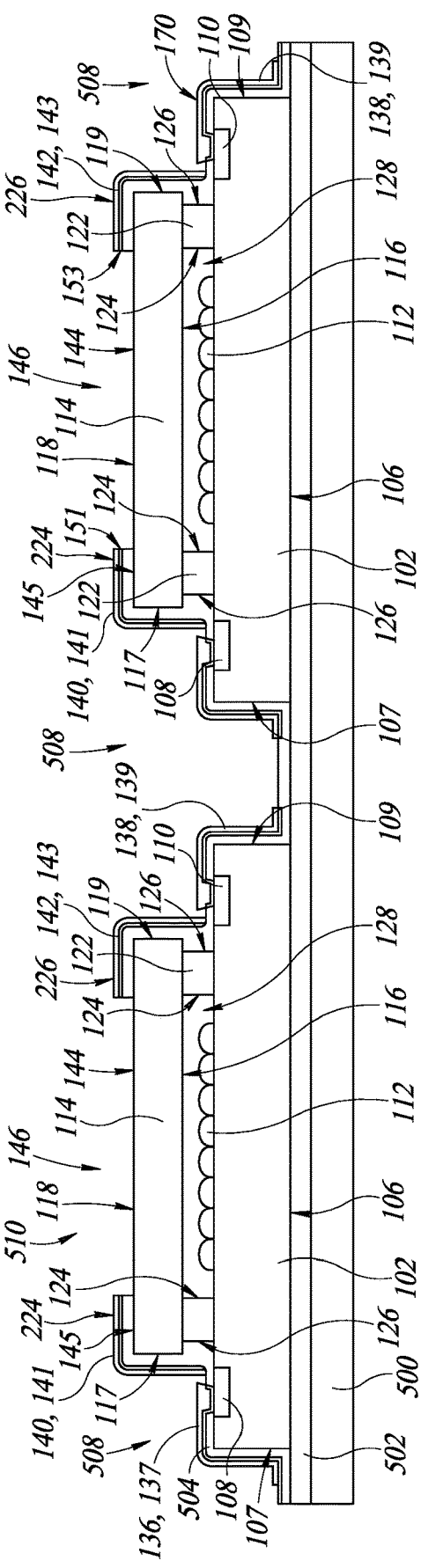

After the layer of doped resin 504 is formed, the first, second, third, fourth, fifth, sixth, seventh, and eighth conductive layers 136, 137, 138, 139, 140, 141, 142, 143 are formed as shown in FIG. 8B. The first, third, fifth, and seventh conductive layers 136, 138, 140, 142 are formed by a laser-direct structuring (LDS) technique, and the second, fourth, sixth, and eighth layers are formed by a plating technique, which is performed after carrying out the LDS technique.

Forming the first, third, fifth, and seventh conductive layers 136, 138, 140, 142 includes selectively exposing a laser to selected portions of the layer of doped resin 504 corresponding to locations at which the first, third, fourth, and fifth layers are present in the sensor package 200 as shown in FIG. 5. For example, a laser is directed along surfaces of the layer of doped resin 504 and may partially deteriorate the layer of doped resin 504 at regions along the surfaces of the layer of doped resin 504 exposed to the laser. The laser activates the additive material within the layer of doped resin 504 and converts the inorganic non-conductive metallic compound from a non-conductive state to a conductive state. In other words, the inorganic non-conductive metallic compound may be converted to a conductive layer, which in this case are the first, third, fifth, and seventh conductive layers 136, 138, 140, 142. The laser may further form microscopically rough surfaces (e.g., micro-rough surfaces) of the layer of doped resin 504 on which the first, third, fifth, and seventh conductive layers 136, 138, 140, 142 are present. While shown as continuously extending along the layer of doped resin 504, the first, third, fifth, and seventh conductive layers 136, 138, 140, 142 may be made of a plurality of discontinuous portions that are on the micro-rough surfaces of the layer of doped resin 504.

After the first, third, fifth, and seventh conductive layers 136, 138, 140, 142 are formed on corresponding portions of the layer of doped resin 504 by activating the inorganic non-conductive metallic compound within the layer of doped resin 504 with the laser, the second, fourth, sixth, and eighth conductive layers 137, 139, 141, 143 are formed by a plating technique. The plating technique may be an electroless plating technique, a chemical plating technique, an autocatalytic plating technique, or some other plating technique for forming the second, fourth, sixth, and eighth conductive layers 137, 139, 141, 143 on a corresponding one of the first, third, fifth, and seventh conductive layers 136, 138, 140, 142. The first, third, fifth, and seventh conductive layers 136, 138, 140, 142 are less thick relative to the second, fourth, sixth, and eighth conductive layers 137, 139, 141, 143. A first overall thickness of the first and second conductive layers 136, 137 may be ~5-μm to 25-μm. A second overall thickness of the third and fourth conductive layer 138, 139 may be 5-μm to 25-μm. A third overall thickness of the fifth and sixth conductive layers 140, 141 may be 5-μm to 25-μm. A fourth overall thickness of the seventh and eighth conductive layers 142, 143 may be 5-μm to 25-μm.

Figure 8C:
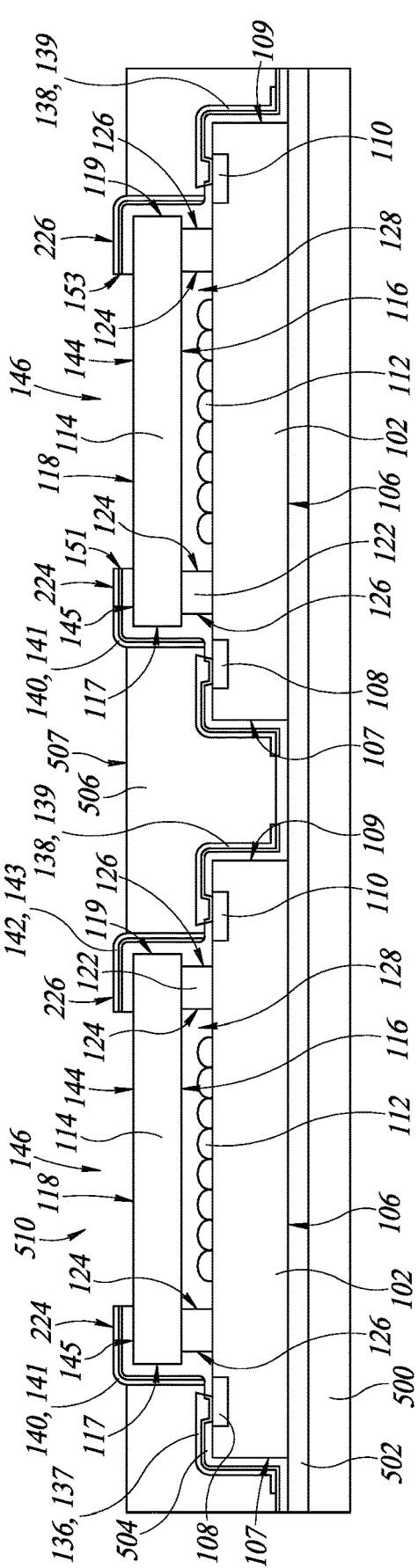

After the first, second, third, fourth, fifth, sixth, seventh, and eighth conductive layers 136, 137, 138, 139, 140, 141, 142, 143 are formed utilizing the LDS technique and the plating technique, a molding compound 506 (e.g., epoxy, resin, or some other suitable non-conductive material) is formed on the respective conductive layers 136, 137, 138, 139, 140, 141, 142, 143 and on the layer of doped resin 504 as shown in FIG. 8C. The molding compound 506 fills recesses 508, which may readily be seen in FIGS. 8A and 8B. At least one of the recesses extends between one of the transparent portions 114 and one of the sensor die 102 as shown in FIG. 8C. The molding compound 506 may be formed by a molding tool technique. For example, a molding tool (e.g., a stencil) may be positioned over the components (e.g., the transparent portions 114, the layer of doped resin 504, the conductive layers, and the sensor die 102) on the first support 500 at which point the molding compound 506 is injected into the molding tool between the components such that the molding compound 506 fills open spaces delimited by the molding tool. After the molding compound 506 is injected, the molding compound 506 is allowed to cure and harden at which point the molding tool may be removed from the components on the first support 500. Forming the molding compound 506 may form a package wafer 510 including at least two transparent portions 114, at least two sensor die 102, at least two support structures 122, and at least two of each of the respective conductive layers 136, 137, 138, 139, 140, 141, 142, 143, which may readily be seen in FIG. 8C. The molding compound 506 includes a surface 507 recessed below the respective surfaces 222, 224.

Figure 8D:
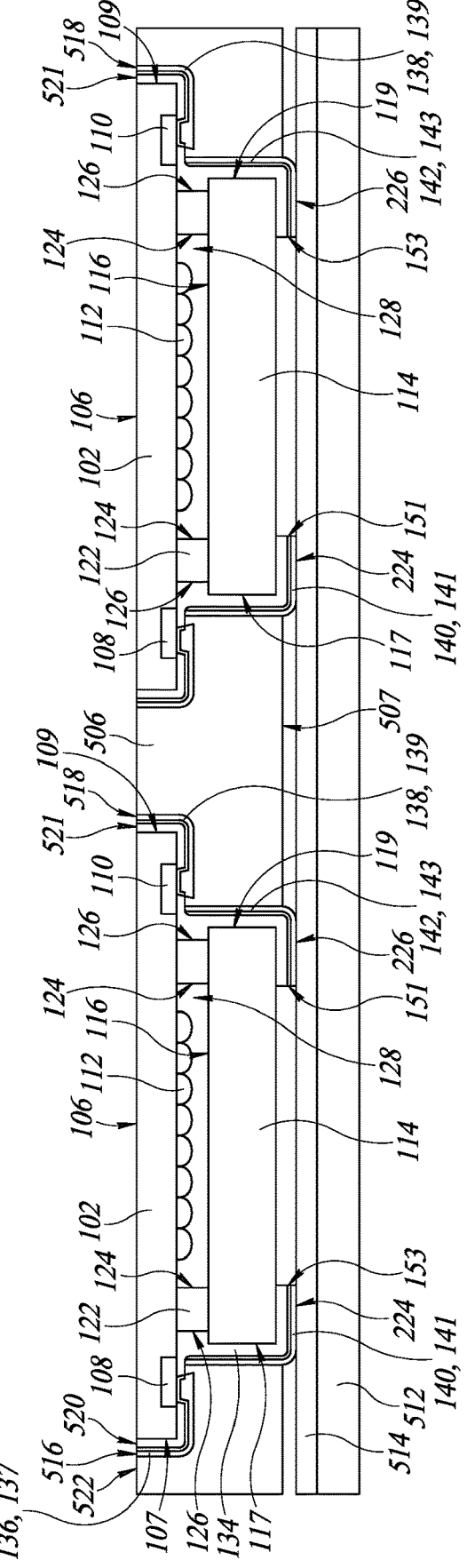

After the molding compound 506 is formed, the package wafer 510 is removed from the adhesive 502 and the first support 500 and is flipped and is then coupled to a second support 512 by an adhesive 514, which is temporary, utilizing a flip chip technique as shown in FIG. 8D. For example, a pick and place machine may pick up the package wafer 510, flip the package wafer 510, and then place the package wafer 510 on the adhesive 514 in a flipped orientation relative to the orientation of the package wafer 510 as shown in FIG. 8C.

After the package wafer 510 is flipped and temporarily coupled to the adhesive 514 on the second support, a grinding technique is performed to remove portions of the layer of the doped resin 504, the first, second, third, and fourth conductive layers 136, 137, 138, 139, and the molding compound 506 as shown in FIG. 8D. The grinding technique may be carried out by a grinding tool such as a grinding wheel, a polish grinding wheel, or some other type of grinding tool. This grinding technique forms first end surfaces 516 of the first and second conductive layers 136, 137 and second end surfaces 518 of the third and fourth conductive layers 138, 139. The first end surfaces are end surfaces of the first and second conductive layers 136, 137, and the second end surfaces are surfaces of the third and fourth conductive layers 138, 139. This grinding technique forms third end surfaces 520 and fourth end surfaces 521 of the layer of doped resin 504 and forms a surface 522 of the molding compound 506. The grinding technique thins the sensor die 102 as well. The first, second, third end surfaces and fourth end surfaces 516, 518, 520, 521, the surface of the molding compound 506, and the second surface 106 of the sensor die 102 are substantially flush and coplanar with each other.

Figure 8E:
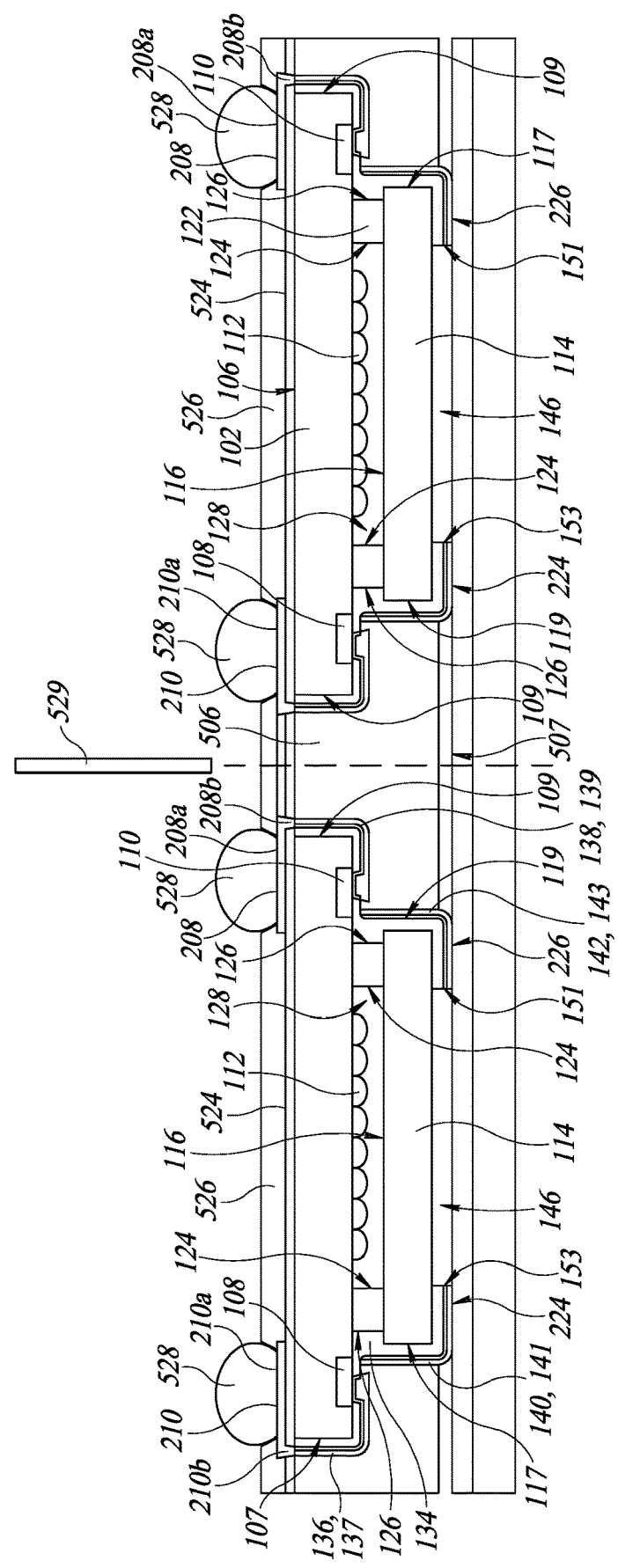

After the flip chip technique and the grinding technique are completed, a first non-conductive layer 524, a second non-conductive layer 526, and ones of the ninth and tenth conductive layers 208, 210 are formed on the package wafer 510 of the molding compound 506 by a combination of patterning techniques and deposition techniques such as a sputtering techniques, a spraying techniques, resist layer formation techniques, or some other suitable deposition techniques or combination of deposition techniques for forming a stacked structure of the respective layers as shown in FIG. 8E. The ninth conductive layer 208 is in electrical communication or electrically coupled to the first and second conductive layers 136, 137, and the tenth conductive layer 210 is in electrical communication or electrically coupled to the third and fourth conductive layers 138, 139. The ninth conductive layer 208 may be formed on the first end surface of the first and second conductive layers 136, 137 on the right-hand side of the left-most sensor die 102 as shown in FIG. 8E. The tenth conductive layer 210 may be formed on the second end surface of the third and fourth conductive layers 138, 139 on the left-hand side of the left-mot sensor die 102.

After the first and second non-conductive layers 524, 526 and the ninth and tenth conductive layers 208, 210 are formed, a plurality of solder balls 528 are formed on the surfaces of the ninth and tenth conductive layers 208, 210 exposed from the first and second non-conductive layers 524, 526. After the solder balls are formed, a singulation tool 529 singulates the package wafer 510 in individual ones of the sensor package 200 as shown in FIG. 5. After this singulation process is carried out, the individual ones of the sensor packages 200 coupled to the adhesive 514 on second support are removed from the second support. For example, the individual ones of the sensor packages 200 may be removed from the adhesive 514 on the second support by a pick and place machine.

Figure 9:
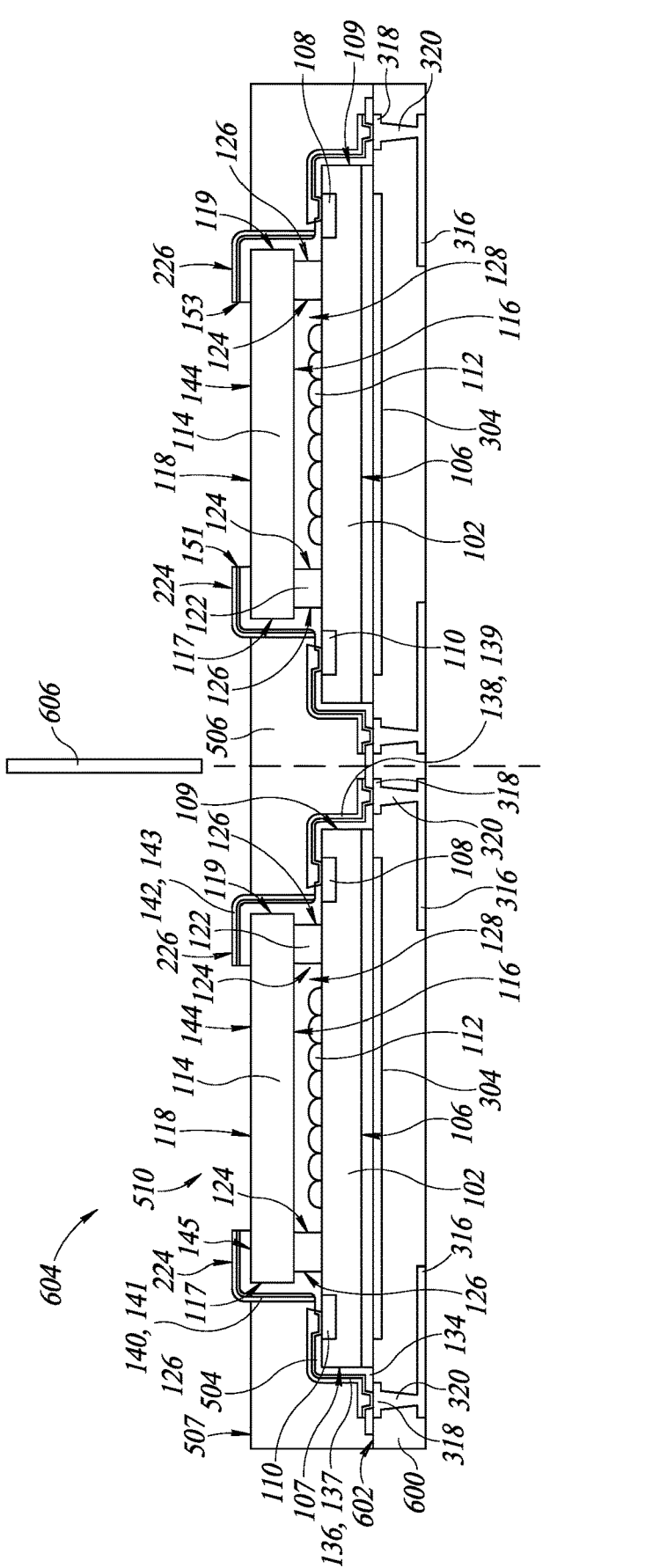
FIG. 9 illustrates a cross-sectional view of an embodiment of a method of manufacturing the alternative embodiment of the sensor package as shown in FIG. 5.

FIG. 9 illustrates an embodiment of a method of manufacturing the sensor package 300 as shown in FIG. 6. Unlike the embodiment of the method of manufacturing the sensor package 200 as shown in FIG. 5, the sensor die 102 of the sensor package 300 is coupled to a substrate wafer 600 by the adhesive 306. For example, the adhesive 306 may be formed on a surface 602 of the substrate wafer 600 and on one of the conductive pads 304 at the surface 602 of the substrate wafer 600. The sensor die 102 may be placed on the adhesive 306 by a pick and place machine. After coupling the die to the surface of the substrate wafer 600 utilizing the adhesive 306, the same or similar steps as shown in FIGS. 8A-8C may be carried out to form the sensor package 300 as shown in FIG. 6. However, the substrate replaces the first and second supports, which are temporary as discussed earlier with respect to forming the sensor package 200 as shown in FIGS. 8A-8C. After the steps in FIGS. 8A-8C are carried out, a package wafer 604 is singulated by a singulation tool 606 forming individual ones of the sensor packages 300 as shown in FIG. 6.

Figure 10A:
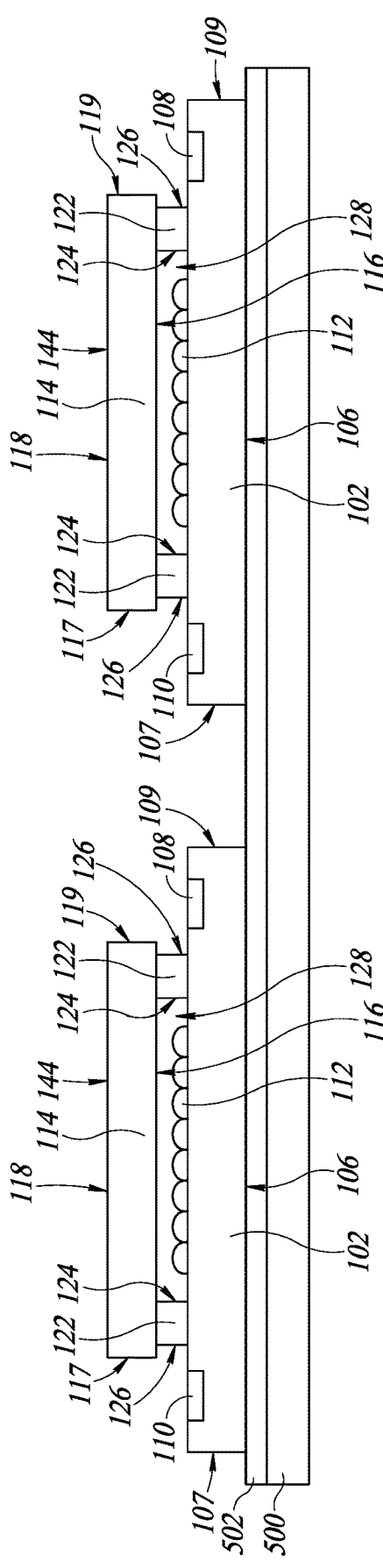
FIGS. 10A-10D illustrate cross-sectional views of an embodiment of a method of manufacturing the embodiment of the sensor package as shown in FIG. 1.
Figure 10B:
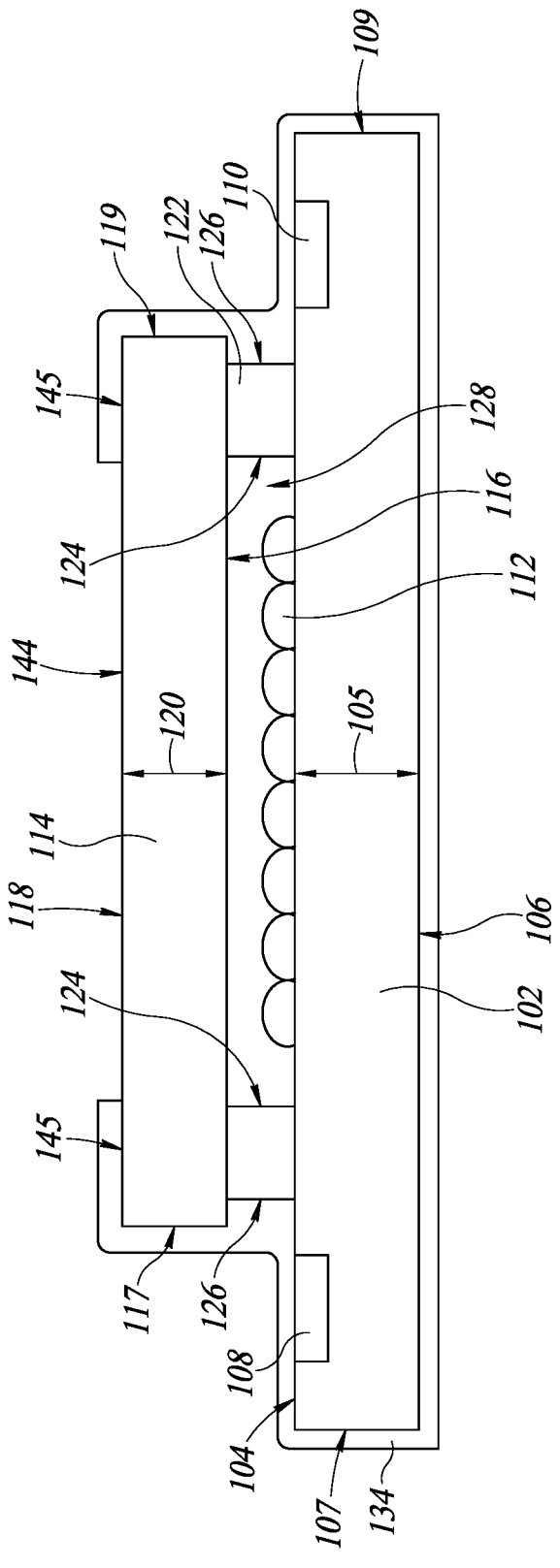
Figure 10C:
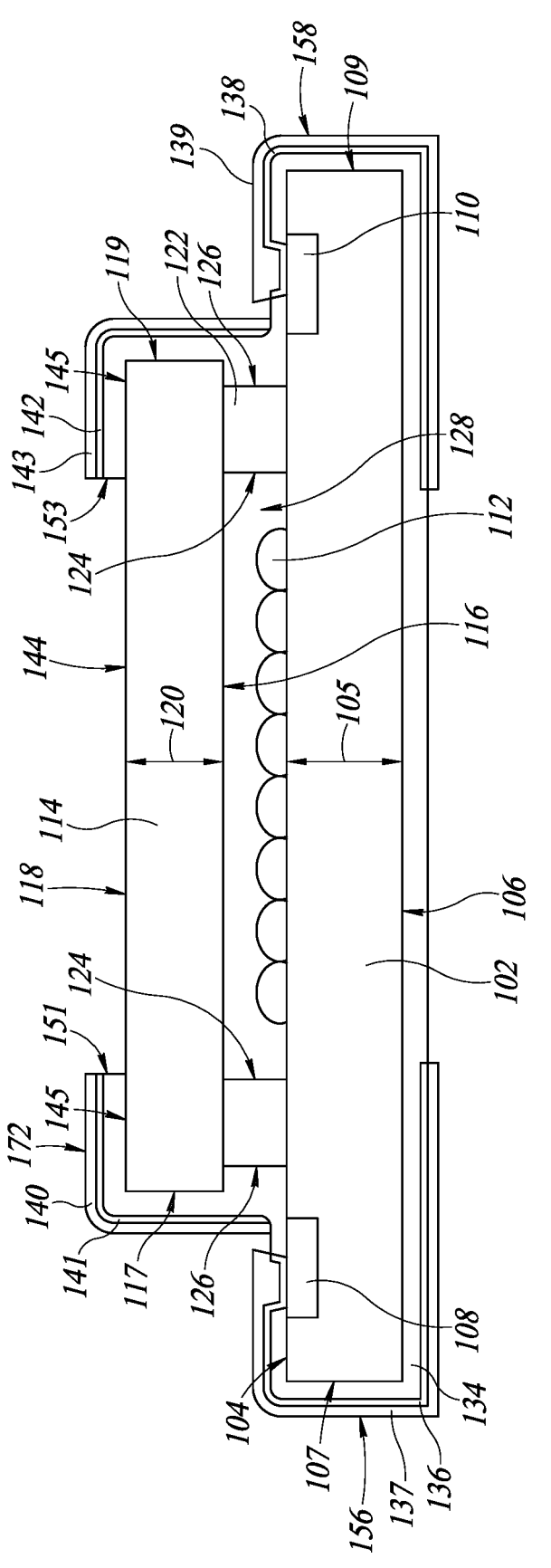
Figure 10D:
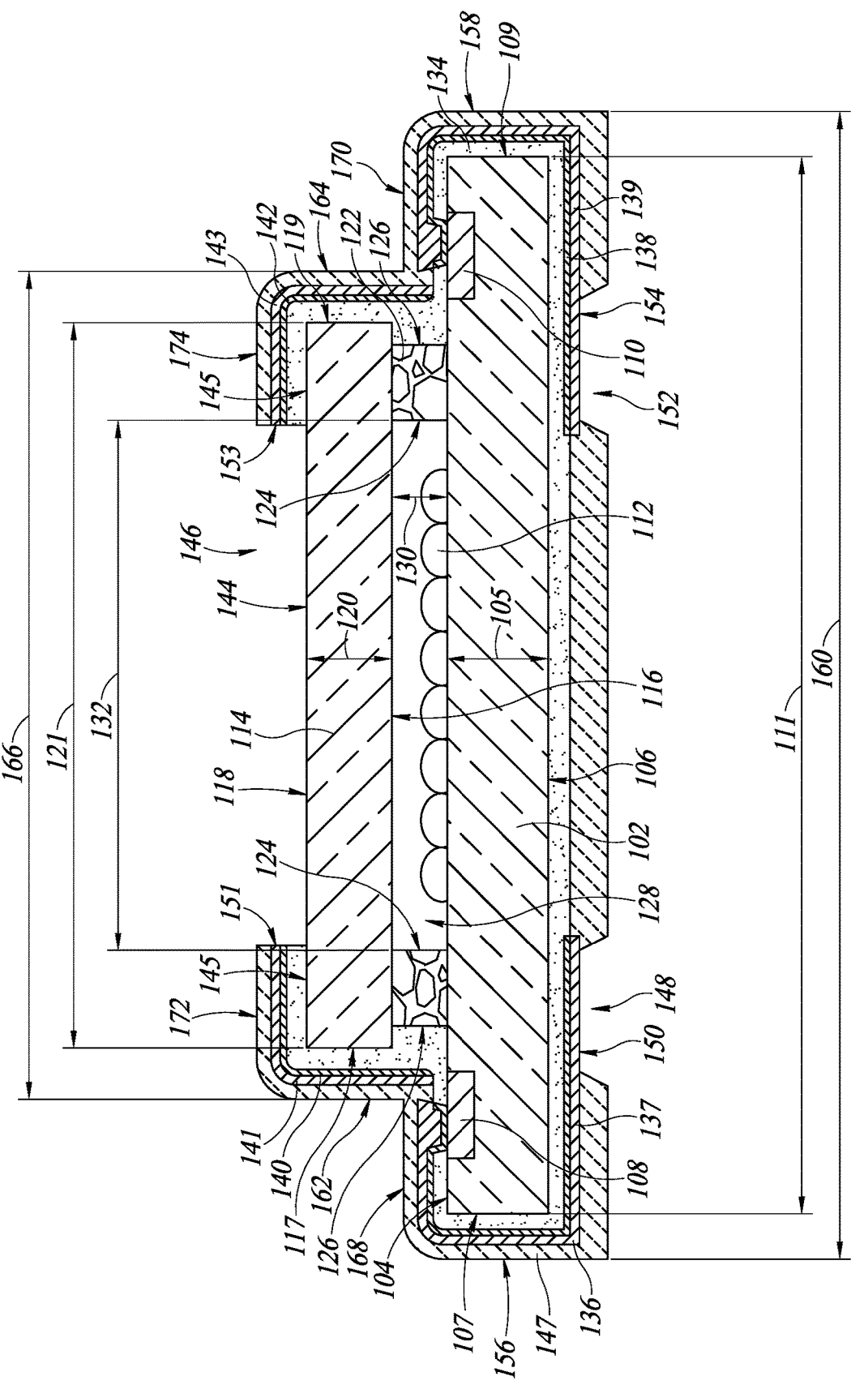

FIGS. 10A-10D are directed to an embodiment of a method of manufacturing the sensor package 100 as shown in FIG. 1, which is utilized in the sensor package 400 as shown in FIG. 7. The steps as discussed earlier with respect to FIG. 8A are carried out in the same manner to form the support structures 122 on corresponding ones of the sensor die 102 and couple the transparent portions 114 to corresponding ones of the sensor die 102 by the support structures 122. However, unlike FIG. 8A, the layer of doped resin 504 is not formed on the sensor die 102, the support structures 122, and the transparent portions 114 in FIG. 10A. Instead, once the support structures 122 are formed on corresponding ones of the sensor die 102 and the transparent portions 114 are coupled to corresponding ones of the support structure 122, the transparent portions 114, the support structures 122, and the sensor die 102, which are in a stacked configuration as shown in FIG. 10A, are removed from the adhesive 502 on the first support 500. The transparent portions 114, the support structure 122, and the sensor die 102 may be removed from the adhesive 502 by a pick and place machine.

After the transparent portion 114, the support structure 122, and the sensor die 102 on the left-hand side of FIG. 10A are removed from the adhesive 502 on the first support 500, the doped resin 134, which is a layer of the doped resin 134, is formed on the respective surfaces and sidewalls of the transparent portion 114, the support structure 122, and the sensor die 102, respectively. The doped resin 134 may be formed on theses surfaces and sidewalls by spraying the doped resin 134 onto these surfaces and sidewalls. For example, the pick and place machine may hold the transparent portion 114, the support structure 122, and the sensor die 102 in a first orientation, and the doped resin 134 is then sprayed onto the transparent portion 114, the support structure 122, and the sensor die 102 when in the first orientation. After the first spray application of the doped resin 134, the pick and place machine may put down the transparent portion 114, the support structure 122, and the sensor die 102 and then pick up the transparent portion 114, the support structure 122, and the sensor die 102 again in a second orientation different from the first orientation. While in the second orientation, a second spray application of the doped resin 134 may be sprayed onto the sensor die 102 to cover the respective surfaces and sidewalls of the transparent portion 114, the support structure 122, and the sensor die 102. In other words, multiple spraying steps and reorientation steps may be carried out to form the doped resin 134 on the respective surfaces and sidewalls of the transparent portion 114, the support structure 122, and the sensor die 102. The doped resin 134 may be of substantially uniform thickness.

The doped resin 134 may be sprayed onto the respective surfaces and sidewalls in a selective manner such that the fourth surface 118 of the transparent portion 114. In an alternative embodiment, a temporary protective layer may be present on the fourth surface 118 corresponding to the location at which the first opening 146 is to be present. The first opening 146 may be formed by deteriorating the temporary protective layer. For example, the temporary protective layer may be a material that deteriorates when exposed to air, to water, or to a chemical.

After the doped resin 134 has been formed on the respective surfaces and sidewalls of the transparent portions 114, the support structure 122, and the sensor die 102, the first, third, fifth, and seventh conductive layers 136, 138, 140, 142 may be formed by an LDS technique. For example, similar to how the doped resin 134 is formed, the pick and place machine picks up the transparent portion 114, the support structure 122, and the sensor die 102 in a first orientation and a laser is then exposed to first respective portions of the doped resin 134. After the laser is exposed to the first respective portions of the doped resin 134, the pick and place machine may reorient the transparent portion 114, the support structure 122, and the sensor die 102 to a second orientation different from the first orientation. After being reoriented to the second orientation, the laser may be exposed to second respective portions of the doped resin 134 different from the first respective portions of the doped resin 134. For example, exposing the laser to the first respective portions of the doped resin 134 may completely form the fifth and seventh conductive layers 140, 142 and partially form the first and third conductive layers 136, 138. After exposing the laser to the first respective portions, exposing the laser to the second respective portions may complete the formation of the first and third conductive layers 136, 138. In other words, multiple laser exposure steps and reorientation steps may be carried out to form the first, third, fifth, and seventh conductive layers 136, 138, 140, 142 by activating the additive material in the doped resin 134.

After the first, third, fifth, and seventh conductive layers 136, 138, 140, 142, a plating technique is carried out to form the second, fourth, sixth, and eighth conductive layers 137, 139, 141, 143 on the first, third, fifth, and seventh conductive layers 136, 138, 140, 142. The plating technique is the same or similar to the plating technique as discussed earlier with respect to FIG. 8B. For the sake of simplicity and brevity of the present disclosure, the discussion of the plating technique is not reproduced here within the present disclosure.

After the first, second, third, fourth, fifth, sixth, seventh, and eighth conductive layers 136, 137, 138, 139, 140, 141, 142, 143 are formed on the doped resin 134, the non-conductive layer is formed on the doped resin 134 and the second, fourth, sixth, and eighth conductive layers 137, 139, 141, 143. The non-conductive layer may be utilizing the spraying steps and the reorientation steps as discussed earlier with respect to forming the doped resin 134. The second and third openings 148, 152 in the non-conductive layer may be formed by selectively forming the non-conductive layer on the doped resin 134 and the second, fourth, sixth, and eighth conductive layers 137, 139, 141, 143. Alternatively, temporary protective layers may be present on the fourth surface 118, the second conductive layer 137, and the fourth conductive layer 139 corresponding to the locations at which the second and third openings 148, 152 are to be present. The second and third openings 148, 152 may be formed by deteriorating the temporary protective layers. For example, the temporary protective layers may be a material that deteriorates when exposed to air, to water, or to a chemical.

A device may be summarized as including a die including a first surface, a second surface opposite to the first surface, and a first sidewall extending from the first surface to the second surface. A support structure on the first surface of the die, the support structure including a second sidewall extending away from the first surface. A transparent portion on the support structure and spaced apart from the die, the transparent portion including a third surface on the support structure, a fourth surface opposite to the third surface and facing away from the die, and a third sidewall extending from the third surface to the fourth surface. A cavity delimited by the support structure, the die, and the transparent portion. A resin extending along the third sidewall, the second sidewall, the first surface, and the first sidewall.

The resin may extend along the second surface of the die and the fourth surface of the transparent portion.

The device may further include a first conductive layer extending along respective portions of the resin on the first surface, the first sidewall, and the second surface, and a second conductive layer being separate and distinct from the first conductive layer, the second conductive layer extending along respective portions of the resin on the second sidewall, the third sidewall, and the fourth surface.

A non-conductive layer may cover the first conductive layer and the second conductive layer.

The device may further include a first conductive layer extending along respective portions of the resin on the first sidewall and the first surface.

The first conductive layer may be covered by a non-conductive layer.

The device may further include a second conductive layer separate and distinct from the first conductive layer extending along respective portions of the resin on the second sidewall and the third sidewall.

A non-conductive layer may cover the first conductive layer and the second conductive layer.

The device may further include a conductive layer extending along the first sidewall, the first surface, the second sidewall, and the third sidewall.

The resin may extend along the second surface and the fourth surface, and the conductive layer may extend along the second surface and the fourth surface.

The die may further include a sensor at the first surface of the die, the sensor being within the cavity.

A device may be summarized as including a support layer including a first surface and a second surface opposite to the first surface. A die including a third surface on the first surface, a fourth surface opposite to the third surface and facing away from the support layer, and a first sidewall extending from the third surface to the fourth surface. A support structure on the fourth surface of the die, the support structure including a second sidewall extending away from the fourth surface. A transparent portion on the support structure and spaced apart from the die, the transparent portion including an exposed surface facing away from the die and a third sidewall extending from the exposed surface towards the die. A cavity delimited by the support structure, the die, and the transparent portion. A resin extending along the first sidewall, the first surface, the second sidewall, and the third sidewall.

The device may further include a first conductive layer extending along respective portions of the resin on the first sidewall and the fourth surface, and a second conductive layer separate and distinct from the first conductive layer, the second conductive layer extending along respective portions of the resin on the second sidewall and the third sidewall.

The resin may extend along the exposed surface. The second conductive layer may extend along respective portions of the resin on the exposed surface.

The device may further include a non-conductive layer covering the first conductive layer and the second conductive layer.

The device may further include a conductive layer extending along respective portions of the resin on the first sidewall, the fourth surface, the second sidewall, and the third sidewall.

The device may further include a non-conductive layer covering the conductive layer.

The support layer may be a passivation layer.

The support layer may be a substrate, and the resin may be on the substrate.

The device may further include a first conductive layer extending along respective portions of the resin on the first sidewall, the fourth surface, and the substrate.

A method may be summarized as including coupling a transparent portion to a support structure on a first surface of a first die. Forming a doped resin on a first sidewall of the die transverse to the first surface, on the first surface of the die, on a second sidewall of the support structure transverse to the first surface, on a third sidewall of the transparent portion transverse to the first surface. Forming a first conductive layer extending along respective portions of the doped resin on the first sidewall and the first surface. Forming a non-conductive layer covering the first conductive layer and the doped resin.

The method may further include forming a second conductive layer separate and distinct from the first conductive layer by forming the second conductive layer on respective portions of the doped resin on the second sidewall and on the third sidewall.

Forming the doped resin further may include forming the doped resin on a second surface of the die opposite to the first surface and on a fourth surface of the transparent portion facing away from the die. Forming the first conductive layer further includes forming the first conductive layer extending along respective portions of the resin on the second surface of the die. Forming the second conductive layer further includes forming the second conductive layer extending along respective portions of the resin on the fourth surface of the transparent portion.

Forming the first conductive layer and forming the second conductive layer may include exposing the resin to a laser during a laser-direct structuring process.

Forming the first conductive layer may include exposing the resin to a laser during a laser-direct structuring process.

The method coupling a support layer to the die.

The support layer may be a substrate.

The support layer may be a passivation layer.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a die including a first surface, a second surface opposite to the first surface, and a first sidewall extending from the first surface to the second surface;
a support structure on the first surface of the die, the support structure including a second sidewall extending away from the first surface;
a transparent portion on the support structure and spaced apart from the die, the transparent portion including a third surface on the support structure, a fourth surface opposite to the third surface and facing away from the die, and a third sidewall extending from the third surface to the fourth surface;

a cavity delimited by the support structure, the die, and the transparent portion; and a resin extending along the third sidewall, the second sidewall, the first surface, and the first sidewall, and the resin extends along the second surface of the die and the fourth surface of the transparent portion.

2. The device of claim 1, further comprising:

a first conductive layer extending along respective portions of the resin on the first surface, the first sidewall, and the second surface; and a second conductive layer being separate and distinct from the first conductive layer, the second conductive layer extending along respective portions of the resin on the second sidewall, the third sidewall, and the fourth surface.

3. The device of claim 2, wherein a non-conductive layer covers the first conductive layer and the second conductive layer.

4. The device of claim 1, further comprising a first conductive layer extending along respective portions of the resin on the first sidewall and the first surface.

5. The device of claim 4, wherein the first conductive layer is covered by a non-conductive layer.

6. The device of claim 5, further comprising a second conductive layer separate and distinct from the first conductive layer extending along respective portions of the resin on the second sidewall and the third sidewall, and wherein the second conductive layer is covered by the non-conductive layer.

7. The device of claim 1, further comprising a conductive layer extending along the first sidewall, the first surface, the second sidewall, and the third sidewall.

8. The device of claim 7, wherein:

the conductive layer extends along the second surface and the fourth surface.

9. The device of claim 1, wherein the die further includes a sensor at the first surface of the die, the sensor being within the cavity.

10. The device of claim 1, wherein:

the die includes a first conductive pad and a second conductive pad spaced apart from the first conductive pad at the first surface of the die; and the support structure is positioned between the first conductive pad and the second conductive pad and is spaced inward from the first conductive pad and the second conductive pad.

11. A device, comprising:

a support layer including a first surface and a second surface opposite to the first surface;

a die including a third surface on the first surface, a fourth surface opposite to the third surface and facing away from the support layer, and a first sidewall extending from the third surface to the fourth surface;

a support structure on the fourth surface of the die, the support structure including a second sidewall extending away from the fourth surface;

a transparent portion on the support structure and spaced apart from the die, the transparent portion including an exposed surface facing away from the die and a third sidewall extending from the exposed surface towards the die;

a cavity delimited by the support structure, the die, and the transparent portion; and a resin extending along the first sidewall, the first surface, the second sidewall, and the third sidewall;

a first conductive layer extending along respective portions of the resin on the first sidewall and the fourth surface; and a second conductive layer separate and distinct from the first conductive layer, the second conductive layer extending along respective portions of the resin on the second sidewall and the third sidewall.

12. The device of claim 11, further comprising an opening delimited by one or more sidewalls that is at least partially defined by the resin and the second conductive layer.

13. The device of claim 11, wherein the support layer is a passivation layer.

14. The device of claim 11, wherein:

the support layer is a substrate; and the resin is on the substrate.

15. The device of claim 11, wherein:

the die includes a first conductive pad and a second conductive pad spaced apart from the first conductive pad at the fourth surface of the die; and the support structure is positioned between the first conductive pad and the second conductive pad and is spaced inward from the first conductive pad and the second conductive pad.

16. A device, comprising:

a die including a first surface, a second surface opposite to the first surface, and a first sidewall extending from the first surface to the second surface, the first sidewall is transverse to the first surface and the second surface, the die including a first conductive pad at the first surface;

a support structure on the first surface of the die, the support structure being spaced apart from the first conductive pad, and the support structure including a second sidewall transverse to the first surface of the die;

a transparent portion on the support structure, the transparent portion including a third surface, a fourth surface opposite to the third surface, and a third sidewall that extends from the third surface to the fourth surface, the third sidewall is transverse to the third surface and the fourth surface, and the third surface is on the support structure;

a cavity delimited by the first surface of the die, the second sidewall of the support structure, and the third surface of the transparent portion;

a resin extending along the first surface of the die, the first sidewall of the die, the support structure, the third sidewall of the transparent portion, and the fourth surface of the transparent portion;

a first conductive layer coupled to the first conductive pad, and the first conductive layer extends along the resin present along the first surface of the die, the first sidewall of the die, and the second surface of the die; and a second conductive layer extends along the resin present along the fourth surface of the transparent portion and the third sidewall of the transparent portion.

17. The device of claim 16, further comprising a non-conductive layer on the first conductive layer and on the second conductive layer.

18. The device of claim 17, wherein the non-conductive layer extends along the first conductive layer, the second conductive layer, and the resin that extend along the fourth surface of the transparent portion, the third sidewall of the transparent portion, the support structure, the first surface of the die, the first sidewall of the die, and the second surface of the die.

19. The device of claim 16, wherein:

the die further includes a second conductive pad spaced apart from the first conductive pad; and the support structure is spaced apart from the second conductive pad.

20. The device of claim 19, wherein the support structure is positioned between the first conductive pad and the second conductive pad and is spaced inward from the first conductive pad and the second conductive pad.

\* \* \* \* \*